US006653558B1

(12) United States Patent
Bucher et al.

(10) Patent No.: US 6,653,558 B1
(45) Date of Patent: Nov. 25, 2003

(54) QUICK-INSTALL, FLUSH-MOUNT BRACKET FOR LIGHTS, CEILING FANS AND OTHER FIXTURES

(75) Inventors: John C. Bucher, Ft. Lauderdale, FL (US); Charles E. Bucher, Valrico, FL (US)

(73) Assignee: King of Fans, Inc., Ft. Lauderdale, FL (US)

(*) Notice: Subject to any disclaimer, the term of this patent is extended or adjusted under 35 U.S.C. 154(b) by 113 days.

(21) Appl. No.: 09/848,956

(22) Filed: May 3, 2001

Related U.S. Application Data

(63) Continuation-in-part of application No. 09/792,698, filed on Feb. 23, 2001.

(51) Int. Cl.[7] .................................................. H05K 5/00

(52) U.S. Cl. ............................ 174/50; 174/66; 174/67; 248/220.21; 248/226.11; 248/56.5; 248/906; 248/121; 220/241; 220/3.8

(58) Field of Search .............................. 174/50, 66, 67; 248/274.1, 205.1, 226.11, 226.12, 200, 201, 73, 243, 220.21, 906, 220.22, 220.14, 224.8, 121, 37.6, 565, 225.11, 229.16, 230.9, 231.9, 330.1, 344, 343; 362/432, 382, 404; D26/138; 211/26; 416/146 R; 220/241, 242, 3.8; 48/906

(56) References Cited

U.S. PATENT DOCUMENTS

| | | | | | |
|---|---|---|---|---|---|
| 3,798,584 | A | * | 3/1974 | Person | 174/62 |
| D347,056 | S | * | 5/1994 | Bucher et al. | D23/411 |
| 5,340,277 | A | * | 8/1994 | Whitaker | 340/825.72 |
| 5,477,439 | A | * | 12/1995 | Kowalenko et al. | 362/147 |
| 5,542,819 | A | * | 8/1996 | Bucher et al. | 416/146 R |
| 5,560,101 | A | * | 10/1996 | Sandell et al. | 174/48 |
| 5,947,436 | A | * | 9/1999 | Bucher et al. | 248/27.1 |
| 5,988,580 | A | * | 11/1999 | Bucher et al. | 248/343 |
| 6,010,110 | A | * | 1/2000 | Bucher et al. | 200/296 |
| 6,010,306 | A | * | 1/2000 | Bucher et al. | 416/210 R |

* cited by examiner

*Primary Examiner*—Anthony Dinkins
*Assistant Examiner*—Anton Harris
(74) *Attorney, Agent, or Firm*—Holland & Knight LLP

(57) ABSTRACT

A bracket assembly for connecting a ceiling fan to a support installed within a ceiling, the bracket assembly comprising in combination a male subbracket, a hanger bracket, means for mounting said hanger bracket to the ceiling fan, means for connecting the male subbracket to the hanger bracket, a female subbracket, means for connecting the female subbracket to the support and the subbrackets including means for intercoupling.

37 Claims, 26 Drawing Sheets

QUICK-INSTALL, FLUSH-MOUNT BRACKET FOR LIGHTS, CEILING FANS AND OTHER FIXTURES

CROSS-REFERENCE TO RELATED APPLICATIONS

This application is a continuation-in-part application of application Ser. No. 09/792,698, filed Feb. 23, 2001, the disclosure of which is hereby incorporated by reference herein.

BACKGROUND OF THE INVENTION

1. Field of the Invention

This invention relates to fixtures for mounting to ceilings, walls and other supports. More particularly, this invention relates to bracket assemblies that facilitate mounting of lights, ceiling fans and other fixtures to supports such as wall or ceiling-mounted electrical receptacle boxes.

2. Description of the Background Art

Presently, there exists many types of fixtures that are designed to be ceiling or wall mounted. Typically, lights, ceiling fans and other fixtures are mounted over electrical receptacle boxes installed within the wall or ceiling such that the wiring of the fixture may be easily connected to the household wiring contained within the electrical receptacle box.

Various brackets have been designed for facilitating the mounting of lights, ceiling fans and other fixtures to electrical boxes. The most common type of bracket consists of a mounting plate having holes that are dimensioned and aligned with the standardized threaded holes of the electrical receptacle box. Unfortunately, prior art brackets are often configured in such a manner that the bracket must first be mounted to the electrical box and then the fixture mounted to the bracket, both through the use of screws or other threaded fasteners. Consequently, there presently exists a need for a quick-install mounting bracket that facilitates the quick and easy installation of lights, ceiling fans and other fixtures to an electrical box installed within a wall or ceiling.

Therefore, it is an object of this invention to provide an improvement which overcomes the aforementioned inadequacies of the prior art devices and provides an improvement which is a significant contribution to the advancement of the wall or ceiling mounting bracket art.

Another object of this invention is to provide a bracket assembly for allowing a fixture such as a light fixture to be easily mounted to a support, such as an electrical box flush with the wall or ceiling in which the electrical box is installed, a ceiling fan switch housing, or other support.

Another object of this invention is to provide a quick install, flush-mount bracket for lights, ceiling fans and other fixtures having one subbracket mounted to the support and another subbracket mounted to the fixture, with such subbrackets being easily coupled together such that the fixture may be easily mounted to the support.

Another object of this invention is to provide a quick-install, flush mount bracket for lights, ceiling fans and other fixtures that includes a first subbracket that may be mounted to or made integral with the electrical box serving as a support and a second subbracket that may be mounted to or made integral with the fixture with such subbrackets being easily coupled together such that the fixture may be easily mounted to the electrical box flush with the wall or ceiling.

Another object of this invention is to provide a quick-install, flush mount bracket for lights, ceiling fans and other fixtures that includes a first subbracket that may be mounted to the ceiling or wall and a second subbracket constructed integrally with or attached to the fixture with such subbrackets being easily coupled together such that the fixture may be easily mounted to the ceiling or wall.

Another object of this invention is to provide a quick-install, flush-mount bracket for lights, ceiling fans and other fixtures that includes a first subbracket that may be pre-installed with the electrical box during construction and another subbracket that may be installed with the fixture, possibly at the factory during manufacture, such that the fixture can be easily installed without any particular expertise or tools on the part of the consumer.

The foregoing has outlined some of the pertinent objects of the invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises a quick-install, flush-mount bracket assembly for lights, ceiling fans and other fixtures. More particularly, the bracket assembly of the invention is designed to facilitate the quick installation of a fixture to a support such as for connecting a light, ceiling fan or other fixture to an electrical box installed within a wall or ceiling in such a manner that the fixture is mounted flush with the wall or ceiling. The bracket assembly may be incorporated into interconnecting components such as for interconnecting a light kit to a switch housing of a ceiling fan.

The bracket of the invention comprises numerous embodiments, each including complementary male and female subbrackets. One of the subbrackets is configured and dimensioned to be mounted to the threaded mounting holes of an electrical junction box (the spacing and thread of which are standardized throughout the industry). The other subbracket is configured to be mounted to the light, ceiling fan or other fixture. The subbrackets are complementarily designed to be quickly fastened together such that the fixture may be quickly and easily mounted to the electrical box flush with the wall or ceiling in which the box is installed.

The invention's subbrackets may be sold as a kit and included with the fixture or sold separately for use in conjunction with existing fixtures. Alternatively, the subbracket connected to the fixture may be pre-installed at the factory during manufacture of the fixture. Similarly, the subbracket to be mounted to the electrical box may be pre-mounted to the electrical box at the factory, or before, during, or immediately after construction of the wall or ceiling. In this manner, once the construction is completed (i.e., drywall installed and painted), the fixtures may be quickly and easily installed without any special expertise or tools.

It is noted that for the purposes of the following description and the claims, the subbrackets may be respectively integrally formed with the fixture and/or the electrical box to thereby eliminate the need for having separate components that must then be assembled together and therefore all references to subbrackets encompass being so integrally formed as well as being a separate component.

The invention further comprises an embodiment that is particularly adaptable for use in connecting ceiling fans to electrical box receptacles in ceilings. In this embodiment of the invention, the male subbracket is adapted for connection to a hanger bracket connected to the ceiling fan that allows the ceiling fan to be suspended from the female subbracket to facilitate wiring, and then pivoted upwardly into full assembly through the complementary interconnection of the male subbracket into the female subbracket.

Finally, the male and female subbrackets of the bracket assemblies of the invention may be adapted for use for interconnecting a variety of fixtures to a support, such as for example, allowing a conventional light kit to be easily installed to the bottom of a conventional switch housing of a ceiling fan.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
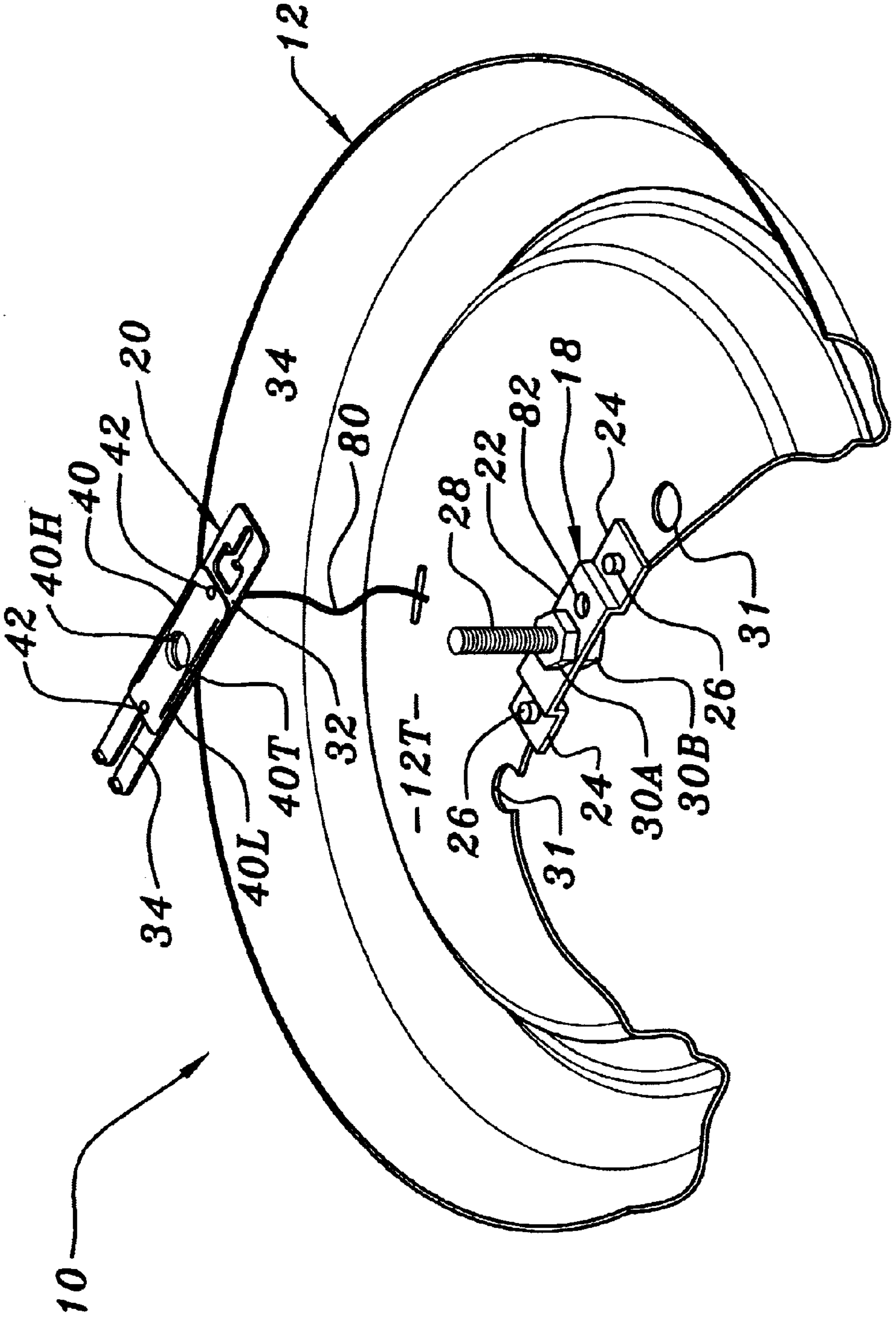
FIG. 1 is a perspective view of the bracket assembly of the invention, partially exploded and partially in cross-section showing the intended coupling of the subbrackets of the bracket assembly.
Figure 2:
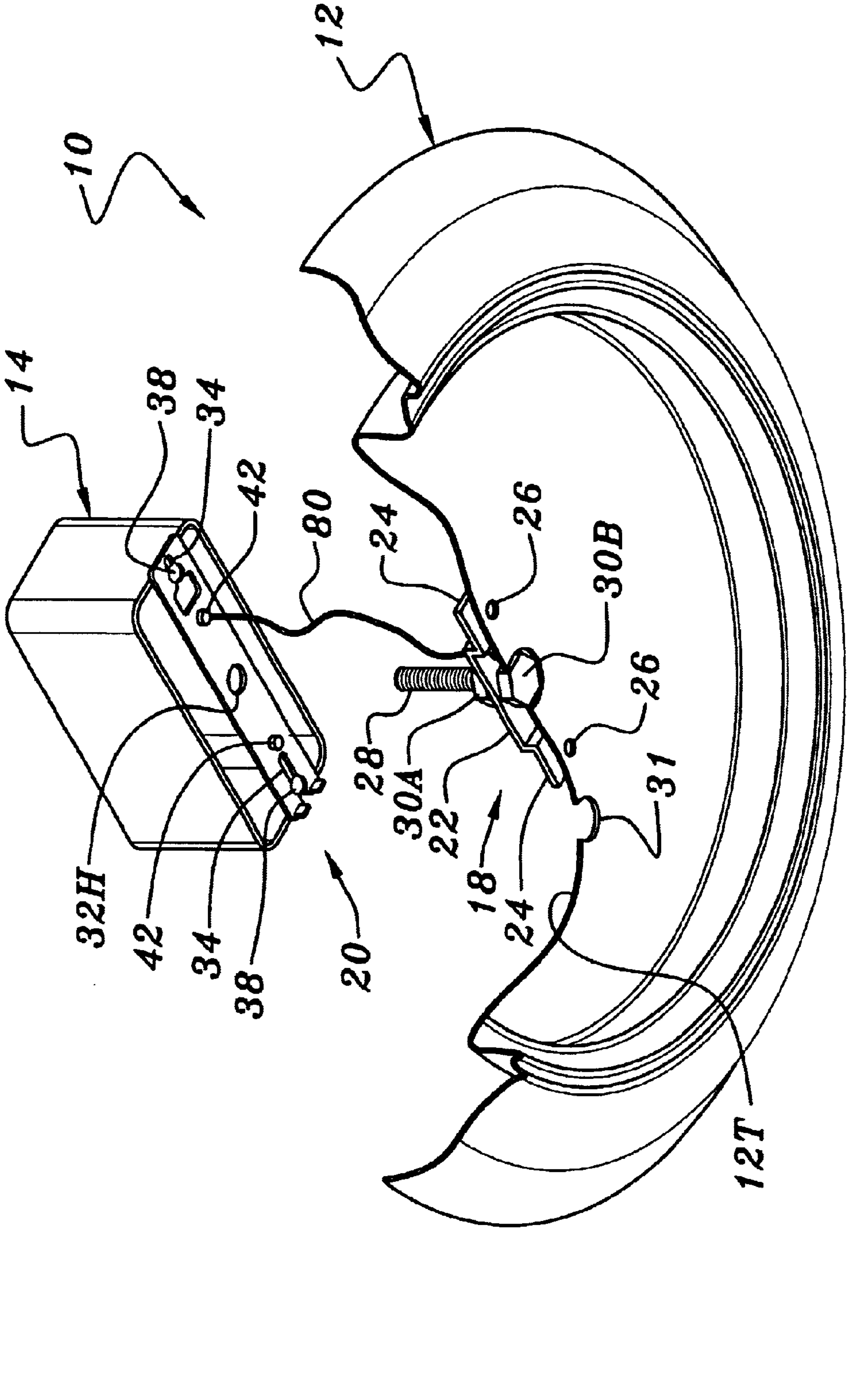
FIG. 2 is a perspective view of the first embodiment of the bracket assembly of the invention, similar to that of FIG. 1, but with the subbracket being connected to a conventional receptacle box.

FIGS. 1–18 illustrate the various embodiments of the bracket assembly 10 of the invention designed to easily couple a light ceiling fan or other fixture 12 to a conventional electrical box receptacle 14 or other support such that the fixture 12 may be flush-mounted to the ceiling or wall 16 in which the electrical box 14 is installed. In each embodiment, the bracket assembly 10 comprises a male subbracket 18 and a female subbracket 20 adapted for installation relative to the fixture 12 or electrical box 14, respectively or vice versa, to facilitate easy flush-mount installation of the fixture to the electrical box 14.

FIGS. 1–5 illustrate the first embodiment of the bracket assembly 10 of the invention. In this first embodiment, the male subbracket 18 is mounted to the fixture 12 and the female subbracket 20 is mounted to the electrical box 14. More particularly, the male subbracket 18 comprises a generally inverted U-shaped mounting plate 22 having radially extending flanged legs 24. The flanged legs 24 of the plate 22 serve to allow the mounting plate to be installed to the topside 12T of the light fixture 12 by means of fasteners 26 such as threaded fasteners, rivets, or the like. A threaded stud 28 is coupled through a hole in the plate 22 and secured into position by opposing threaded nuts 30A and 30B, in such a manner that the threaded stud 28 extends upwardly from the plate 22. However, it is noted that the subbracket 18 may be integrally formed with the fixture 12 such that the threaded stud 26 is threaded directly to the fixture 12 to thereby eliminate the need for having a separate plate 22 with flanged legs 24 that must then be assembled to the top surface 12T of the fixture 12.

The female subbracket 20 of the first embodiment comprises a generally flat mounting plate 32 having a center hole 32H and a pair of mounting holes 34 at opposing ends thereof to allow the mounting plate 32 to be threadedly fastened to the threaded holes 36 of the electrical box receptacle 14. In this regard, it is noted that the spacing of the threaded holes 36, as well as their thread size, is standard throughout the industry. It is also noted that the mounting holes 34 of the mounting plate 32 of the invention may comprise slots as shown to facilitate the ease in which the mounting plate 32 can be mounted to the electrical box 14 via screws 38.

The female subbracket 20 further comprises a leaf plate 40 having opposing leafs 40L circumscribing a center hole 40H defined by longitudinal slots 40LS and transverse slots 40TS (see FIG. 5), the center hole 40H having a diameter appreciably less than the outer diameter of the threaded stud 28. The leaf plate 40 is fastened to the mounting plate 32 by means of fasteners 42 such as threaded fasteners or rivets, such that the center hole 40H of the leaf plate 40 is concentrically aligned with the center hole 32H of the mounting plate 32.

Figure 3:
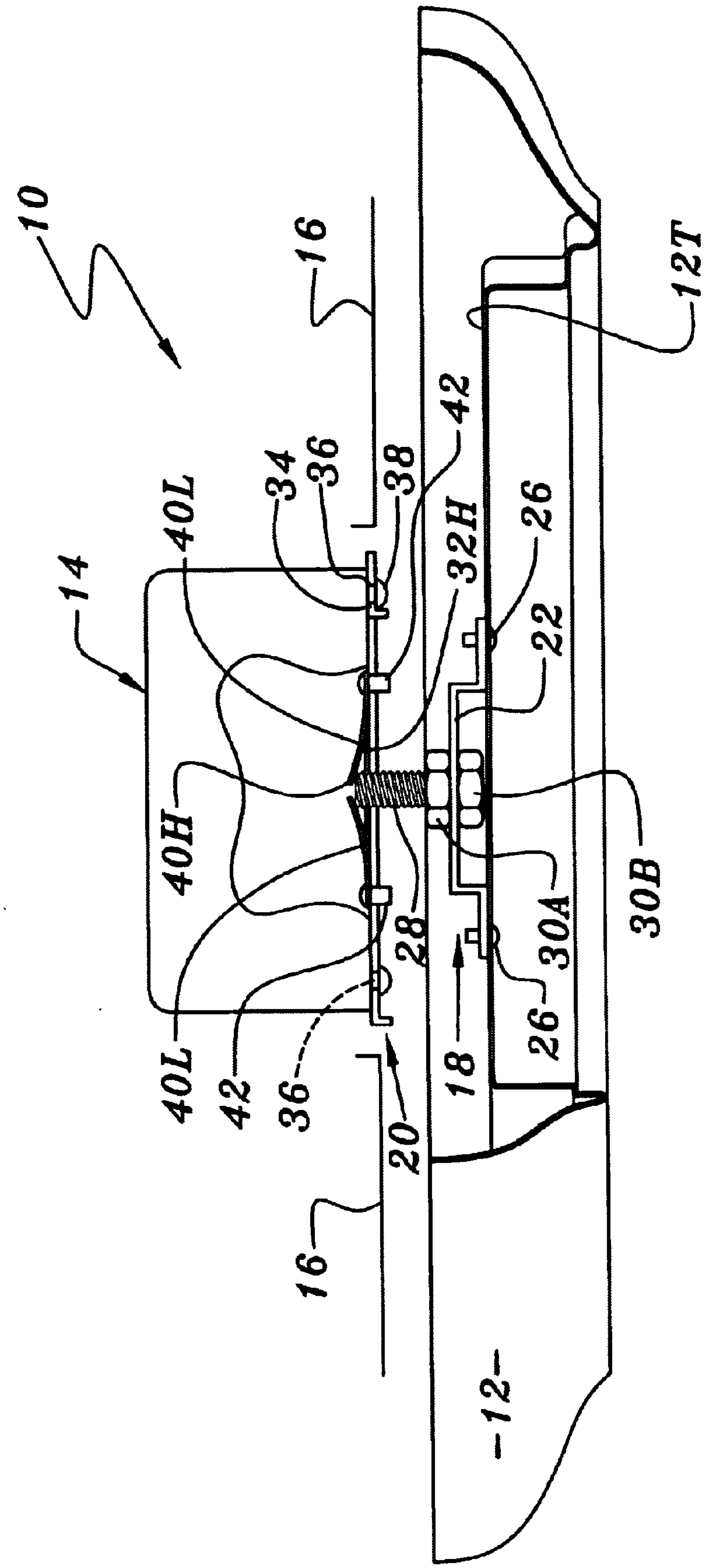
FIG. 3 is a side elevational view, partially in cross-section, showing the initiation of the coupling between the subbrackets of the first embodiment of the bracket assembly shown in FIGS. 1 and 2.
Figure 4:
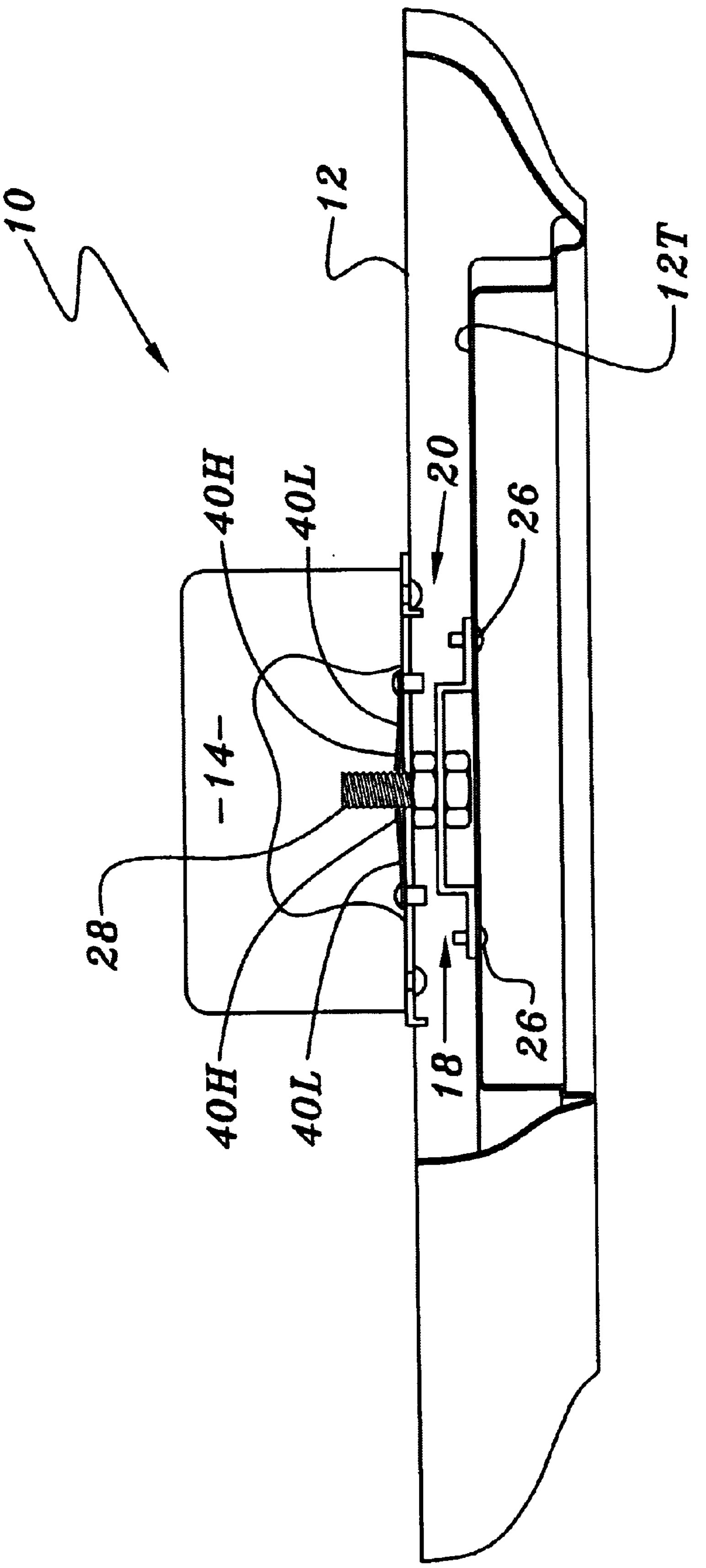
FIG. 4 is a side elevational view, partially in cross-section showing the complete coupling of the subbrackets of FIG. 3 such that the light fixture is mounted flush with the wall or ceiling in which the electrical box is installed.
Figure 5:
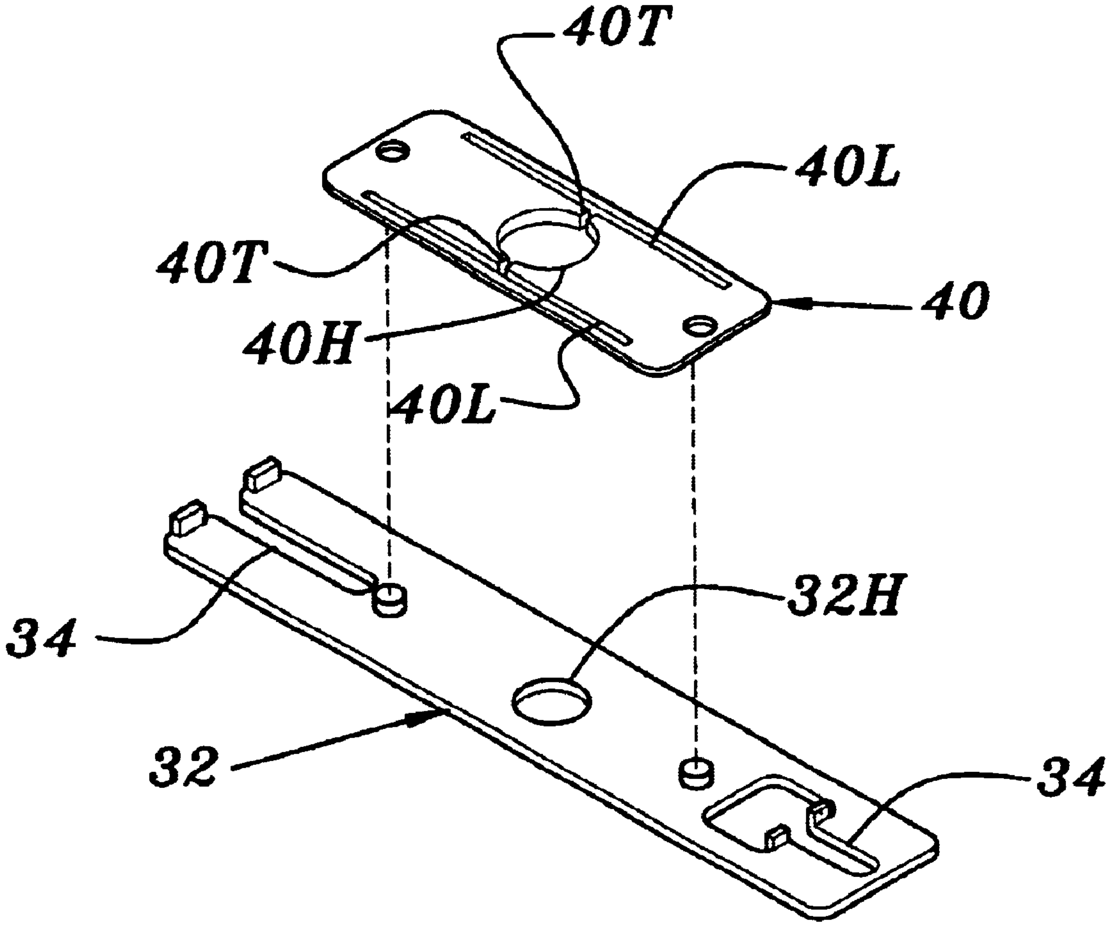
FIG. 5 is an exploded perspective view of one of the subbrackets of the first embodiment of the bracket assembly showing the assembly thereof.

As shown in FIG. 3, the male subbracket 18 may be easily coupled to the female subbracket 20 by merely pushing the threaded stud 28 of the male subbracket 18 through the hole 32H of the mounting plate 32 and then through the smaller diameter hole 40H of the leaf plate 40. During the initiation of such insertion, the opposing leafs 40L defined by the slots 40LS and 40TS spread upwardly and partially away from each other to allow the threaded stud 28 to be fully installed therein. As shown in FIG. 4, upon full insertion of the threaded stud 28 of the male subbracket 18 into the female subbracket 20, fixture 12 is flush-mounted to the ceiling or wall 16 in which the electrical box 14 is installed.

It is noted that the use of the threaded stud 28 and the leaf plate 40 compensates for any non-flush installation of the electrical box 14 relative to the surface of the ceiling or wall 16. Specifically, in the event the electrical box 14 is improperly mounted somewhat recessed from the outer surface of the ceiling or wall 16, the threaded stud 28 is still sufficiently long to penetrate the center hole 40H of the leaf spring 40 to be retained thereby. Further, it is noted that any downward force exerted on the light fixture 12 after coupling, will merely result in the edges of the leaf plate 40 that define the hole 40H, being forced into the troughs of the threads of the threaded stud 28 to even more fully enhance the respective coupling thereof. Finally, it is noted that in the event the light fixture 12 may need to be removed, it could be removed by merely rotating the light fixture 12 in a counter-clockwise direction so as to unthread the threaded stud 28 from the leaf plate 40 (and indeed the leafs 40L may be arcuately formed to better match the pitch of the thread to thereby facilitate unthreading). However, if the fixture is electrically wired to the household wiring contained within the electrical box 14, removal is not permitted due to such wiring that would wrap around the threaded stub 28 during rotation. In such situations, the preferred removal method would comprise removal of the fasteners 26 of the flange legs 24 to release the fixture 12, whereupon the threaded stud 28 of the male subbracket 18 may then be unthreaded from the leaf plate 40.

Figure 6:
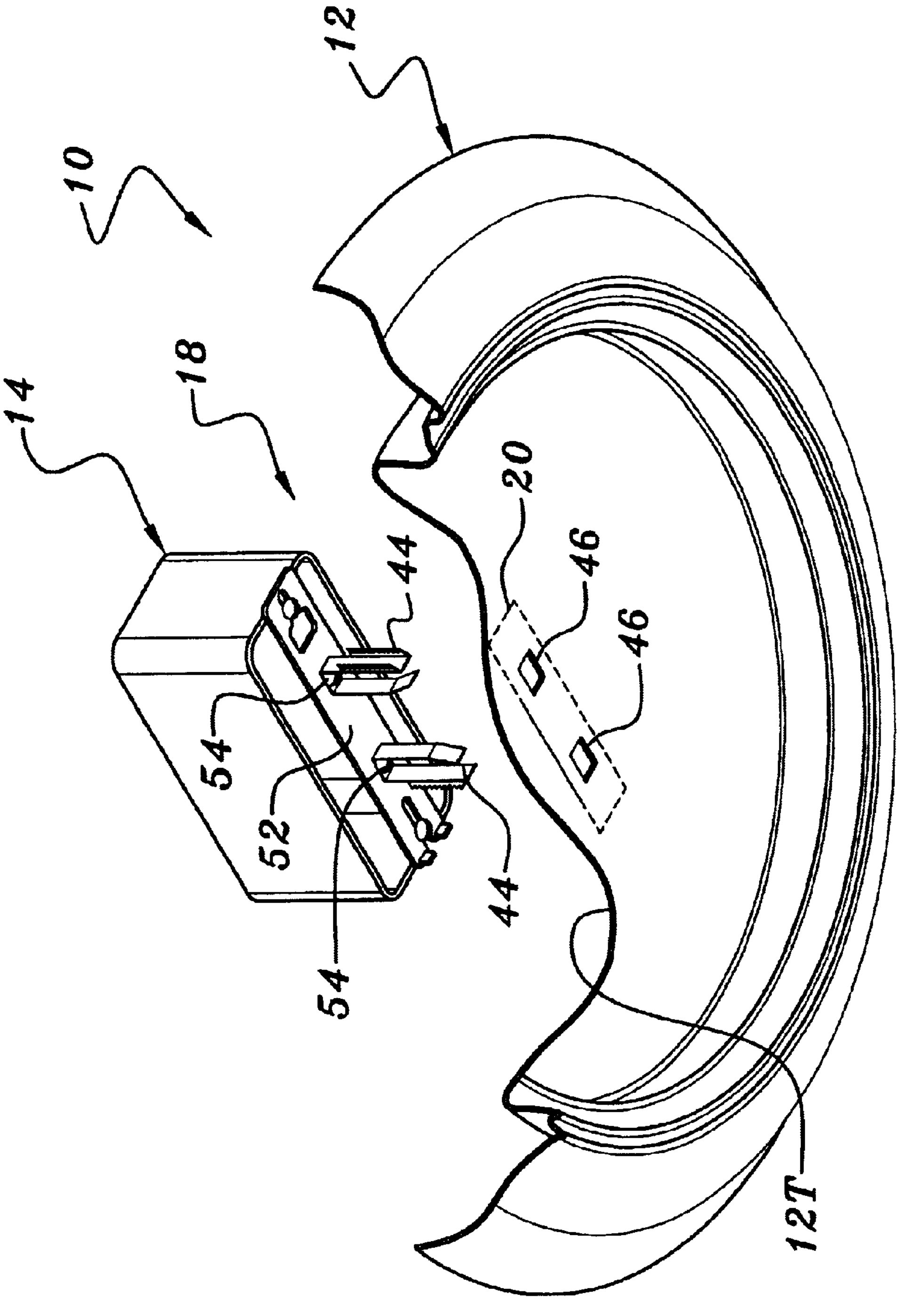
FIG. 6 is a perspective view, partially in cross-section, showing the second embodiment of the bracket assembly of the invention and the manner in which the subbracket thereof is mounted to a conventional electrical box.
Figure 7:
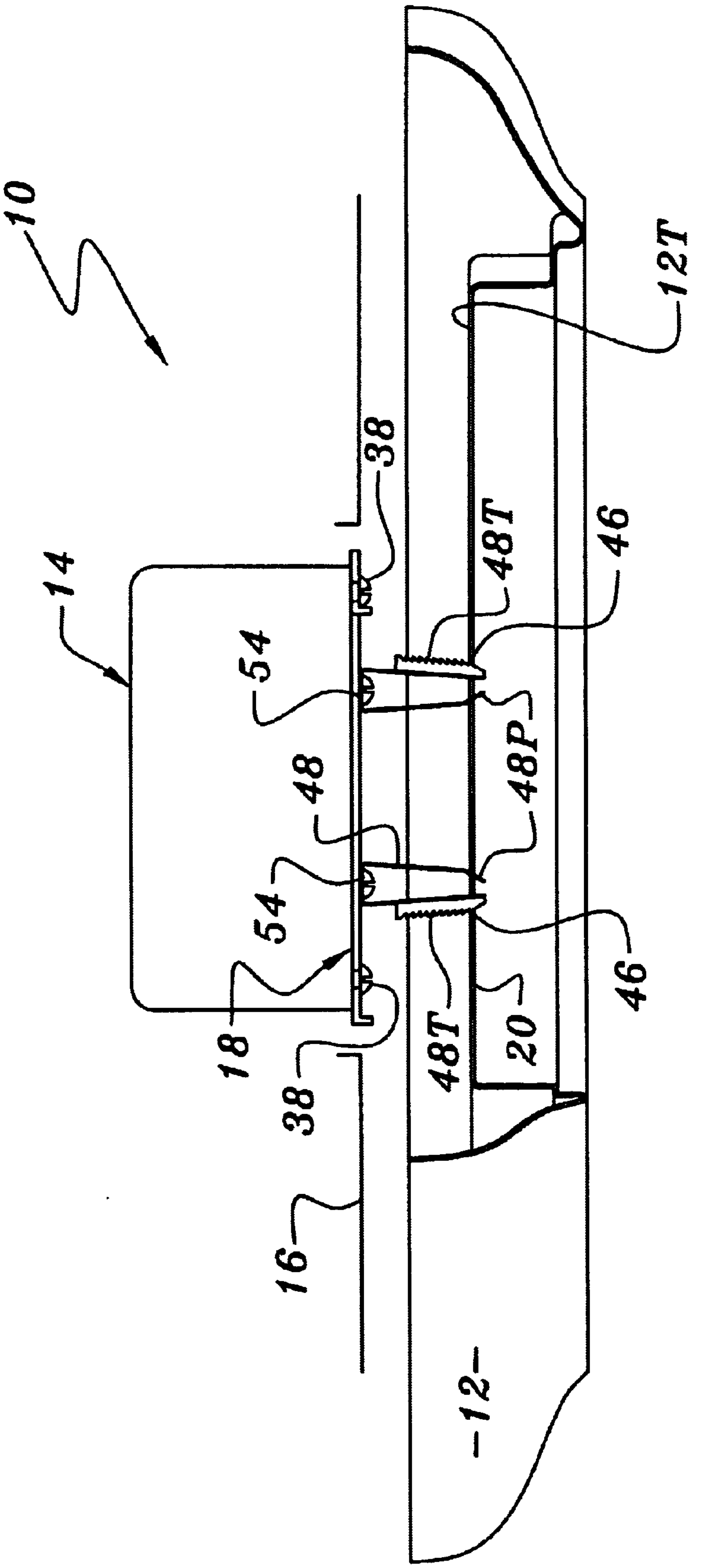
FIG. 7 is a side elevational view of the second embodiment of the bracket assembly of the invention showing the manner in which the subbrackets thereof are initially coupled.
Figure 8:
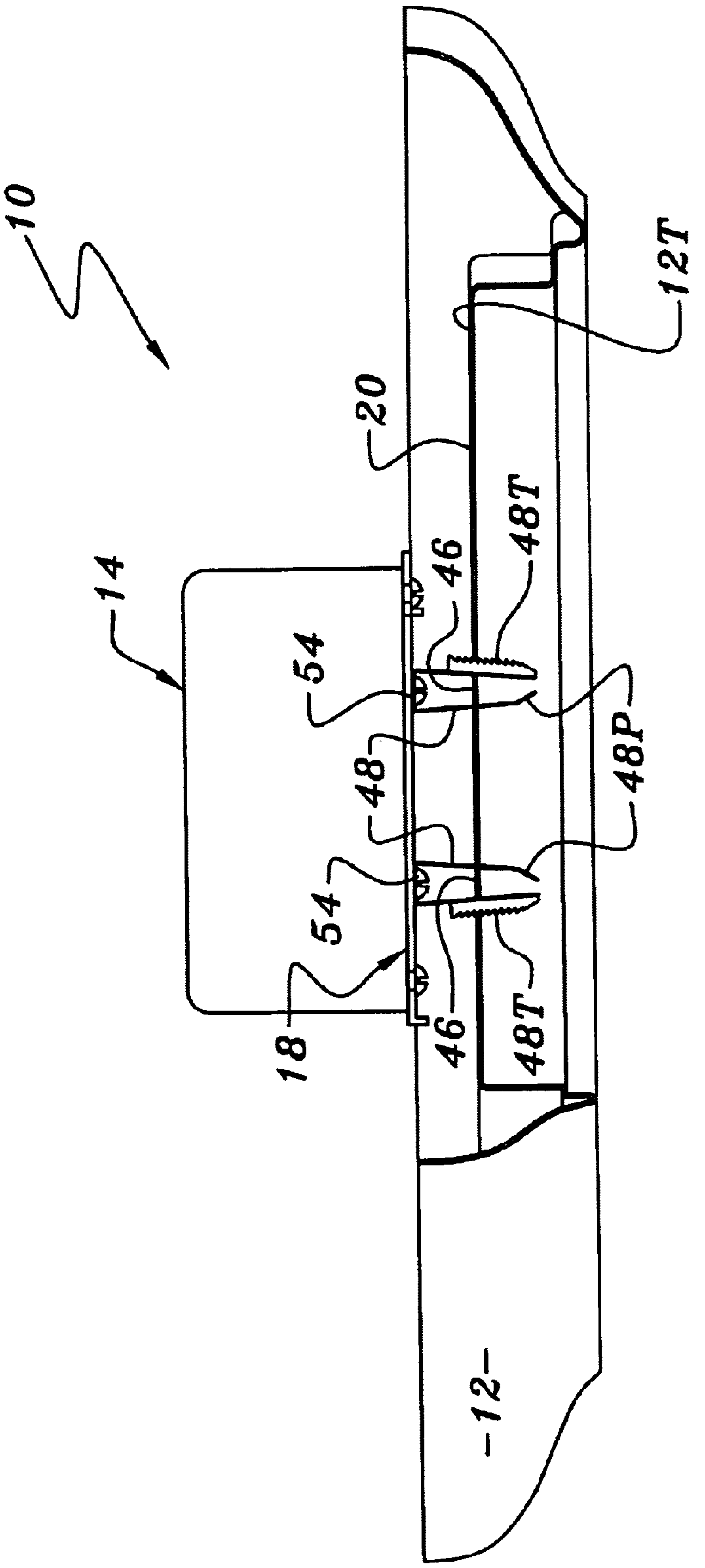
FIG. 8 is a side elevational view of the second embodiment of the bracket assembly of the invention showing the complete coupling of the subbrackets of the bracket assembly such that the light fixture is mounted flush to the wall or ceiling in which the electrical box is installed.
Figure 9:
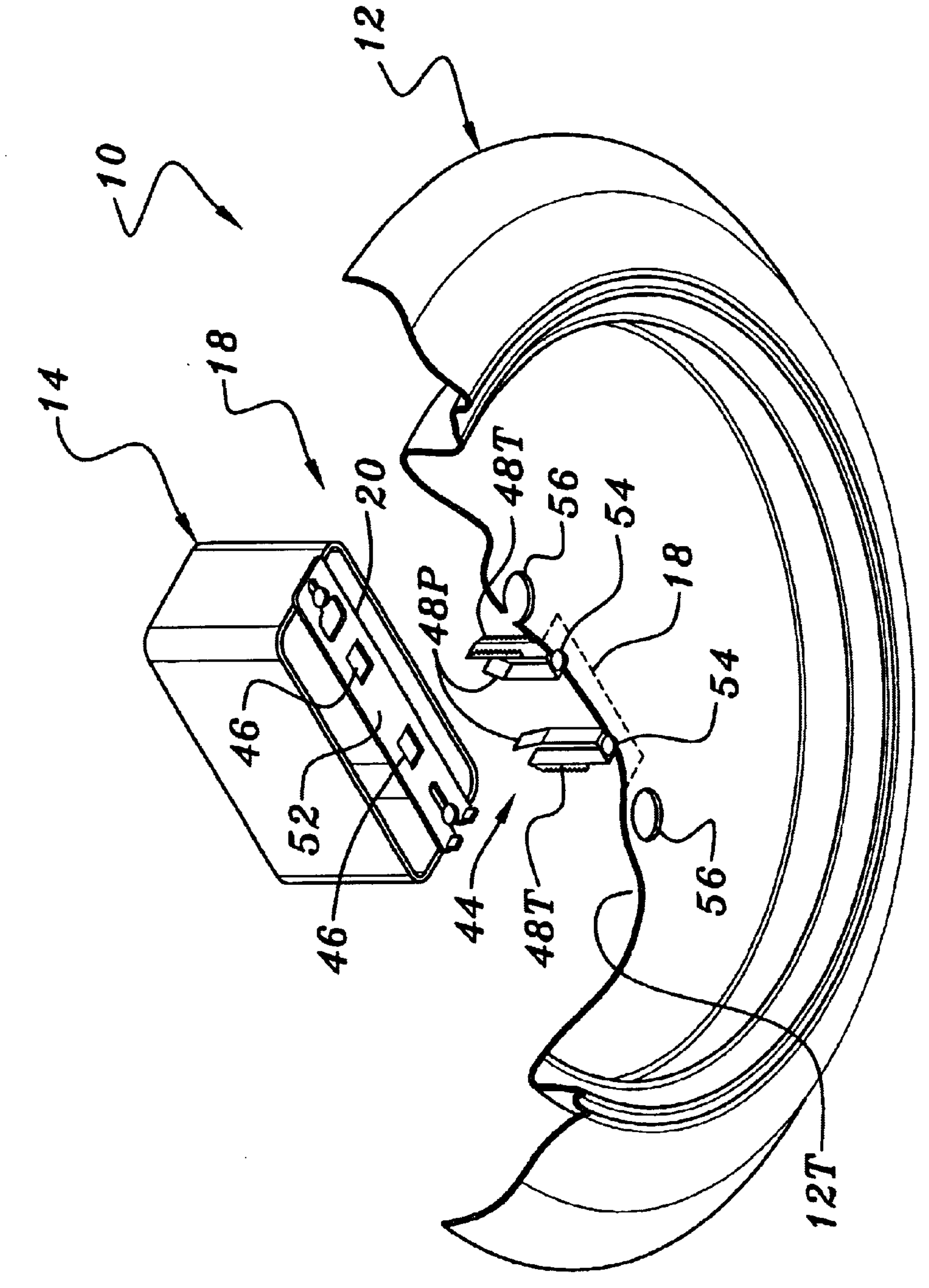
FIG. 9 is a perspective view, partially in cross-section, showing the second embodiment of the invention similar to that of FIGS. 6–8, but with the positioning of the male and female subbrackets being reversed relative to the electrical box and fixture.
Figure 10:
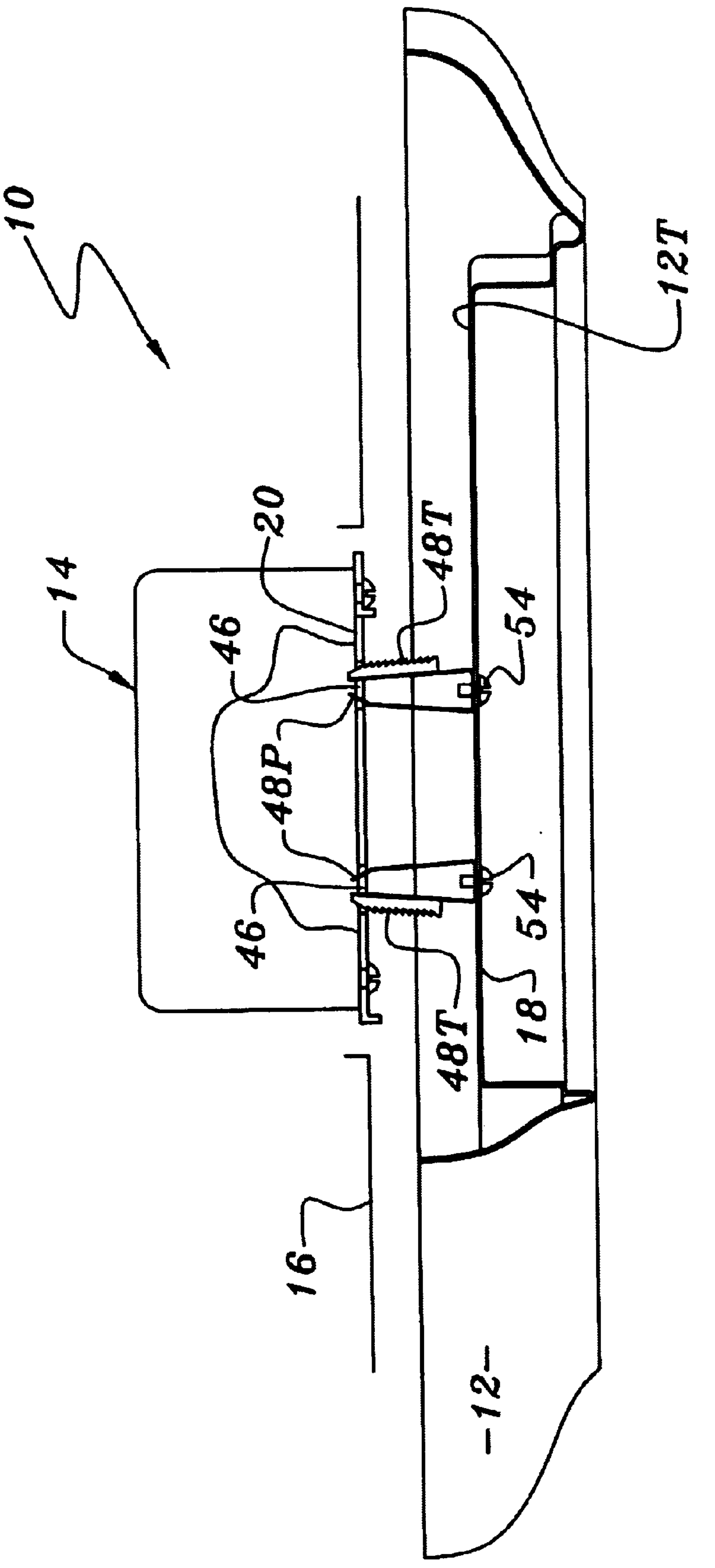
FIG. 10 is a side elevational view, partially cut away, showing the initiation of the male subbracket connection to the fixture being inserted into the female bracket installed on the junction box.
Figure 11:
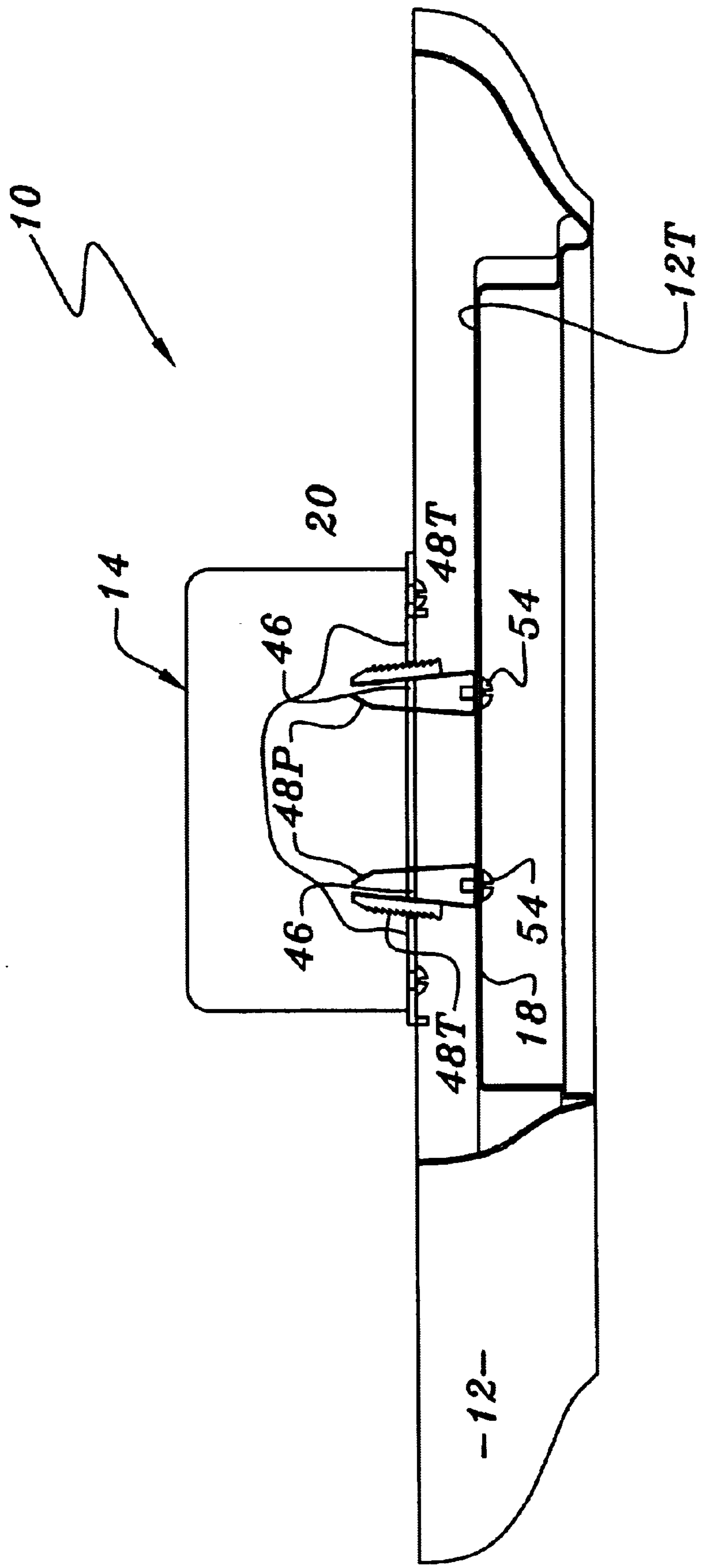
FIG. 11 is a side elevational view similar to that of FIG. 10, but with the subbrackets being fully coupled together to flush-mount the fixture to the ceiling.

The second embodiment of the bracket assembly 10 of the invention is disclosed in FIGS. 6–14. More particularly, the male subbracket 18 of the second embodiment of the bracket assembly 10 comprises a pair of downwardly-extending spring clips 44, preferably composed of a spring steel, that engages into corresponding slots 46 formed in the female subbracket 20. As shown in FIGS. 6–8, the male subbracket 18 including the spring clips 44 may be mounted to the electrical box 14 or, alternatively as shown in FIGS. 9–11, the male subbracket 18 may be formed integrally with the top side 12T of the fixture 12 with the spring clips 44 extending upwardly therefrom for insertion into the female subbracket 20 mounted to the electrical box 14.

More particularly, as shown in FIGS. 6–8, spring clips 44 each comprise a generally inverted U-shaped configuration having legs 48. One leg 48 includes a plurality of indentations or teeth 48T facing outwardly. The other leg 48 may likewise include outwardly facing teeth 48T, but preferably is smooth-configured with its tip 48P arced inwardly as shown. Each of the spring clips 44 is mounted to a mounting plate 52 (similar to mounting plate 32 of the first embodiment) for connection to the electrical box 14 through the use of mounting holes 34 and screws 38, as described above in connection with mounting plate 32 of the first embodiment. Each of the spring clips 44 are securely connected to the mounting plate 52 in a spaced-apart configuration by means of fasteners 54 such as screws or rivets. As shown, the pair of spring clips 44 are oriented such that the teeth 48T of their respective legs 48 face outwardly.

The female subbracket 20 of the second embodiment of the invention is formed integrally with the topside 12T of the fixture 12 and comprises the paired slots 46 that are spaced apart from each other in alignment with the spaced-apart paired spring clips 44. As best shown in FIG. 7, the length of each of the slots 46 is appreciably less than the outer dimensions of the legs 48 of the spring clips 48. In this manner, when the spring clips 44 are aligned with the slots 46, legs 48 must be resiliently squeezed inwardly during initial insertion of them into the slots 46. As best shown in FIG. 8, this inward bending of the legs 48 cause the teeth 48T of leg 48 to function as a ratchet as the spring clips 44 are further inserted into the slots 46. Consequently, the fixture 12 may be easily mounted to the electrical box 14 flush with the surface of the ceiling or wall 16 even in situations in which the electrical box 14 is not itself precisely flush with the ceiling or wall 16. It is noted that removal of the fixture 12 may be easily accomplished by simply squeezing the legs 48 together for each of the spring clips 44 until the teeth 48T of the leg 48 is released from the edge of the slots 46.

FIGS. 9–11 similarly illustrate the second embodiment of the bracket assembly 10 of the invention, but with the male and female subbrackets 18 and 20 being reversed. Specifically, as shown in FIG. 9, slots 46 of the female subbracket 20 may be formed within the mounting plate 32 mounted to the electrical box 14. Conversely, spring clips 44 may be mounted via the fasteners 54 to the top side 12T of the fixture 12 (such topside 12T thereby functioning as the male subbracket 18).

As shown in FIG. 10, the relative alignment of the spring clips 44 relative to the slots 46 allows the spring clips 44 to ratchet completely inwardly into the slots 46 such that the fixture 12 is flush-mounted to the ceiling or wall 16 (see FIG. 11). It is noted that removal of the fixture 12 is rendered more difficult when the male subbracket 18 is mounted relative to the fixture 12 due to the inability to gain access to the legs 48 to squeeze them and cause them to release from the slots 46 of the female subbracket 20. Accordingly, access holes 56 may be provided in the top side 12T of the fixture 12 in alignment with the screws 38 to facilitate removal thereof and hence removal of the fixture 12.

Figure 12:
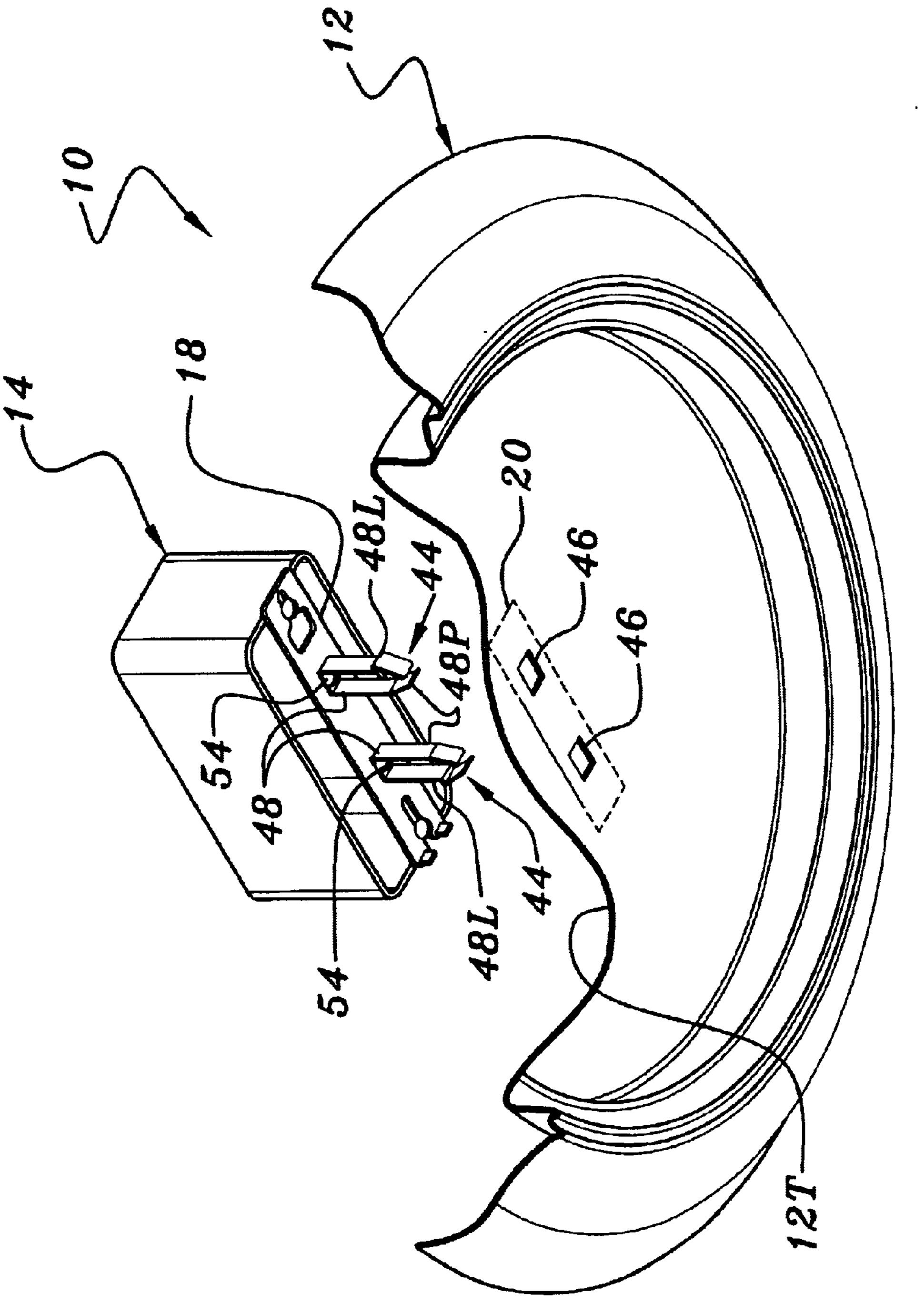
FIG. 12 is a side elevational view, partially in cross-section, showing the third embodiment of the bracket assembly of the invention.
Figure 13:
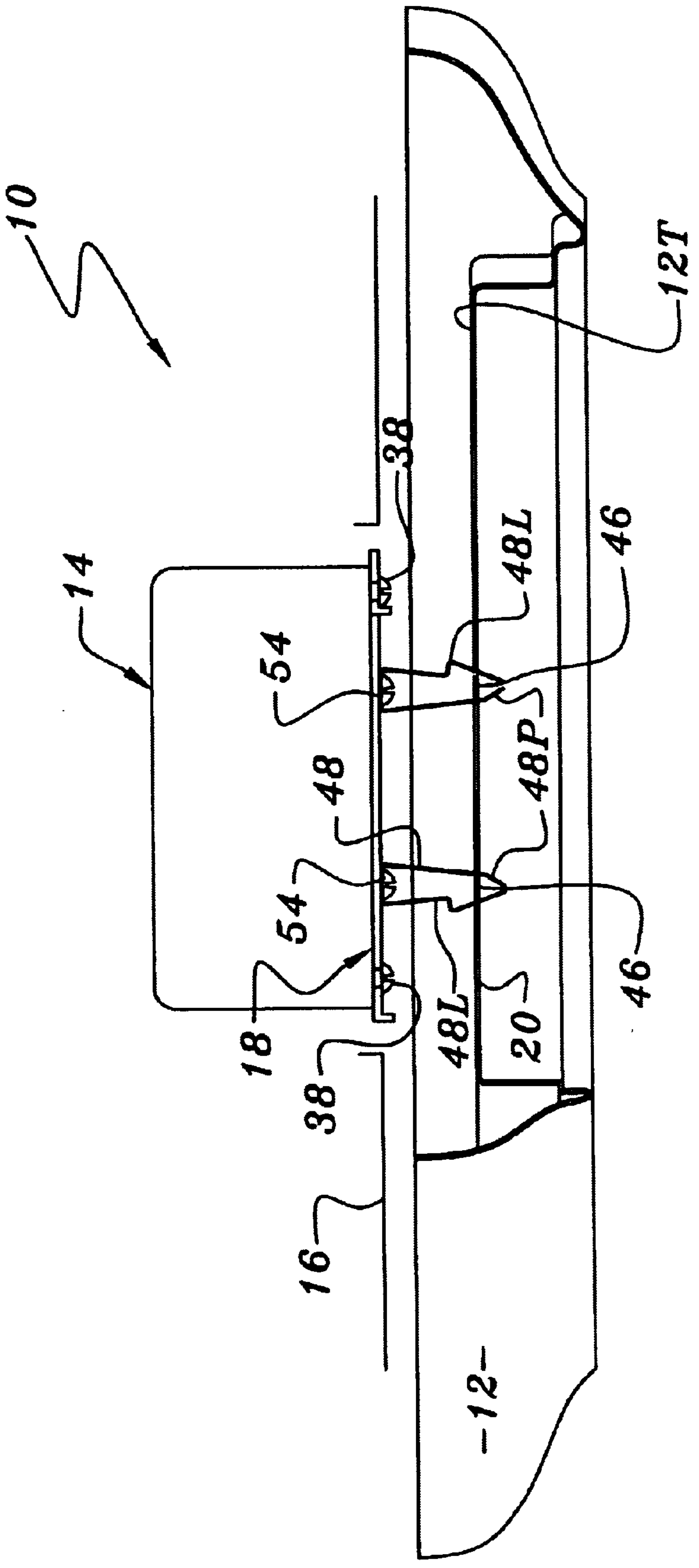
FIG. 13 is a side elevational view of the third embodiment of the bracket assembly showing the initiation of the coupling of the subbrackets thereof.
Figure 14:
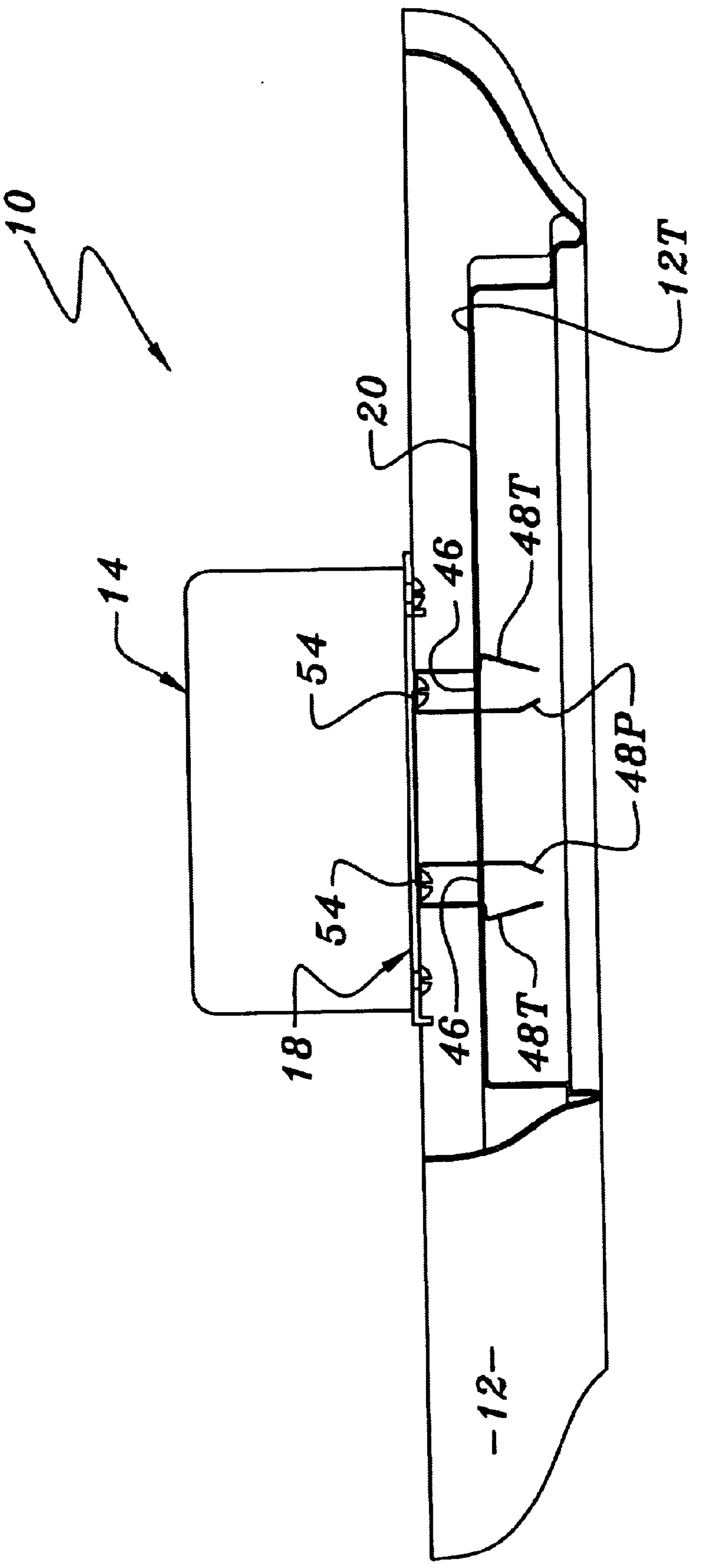
FIG. 14 is a side elevational view, partially in cross-section, showing the complete coupling of the subbrackets of FIG. 13 such that the fixture is mounted to the electrical box flush with the ceiling or wall in which the box is installed.

As a third embodiment, FIGS. 12–14 illustrate a modification to the second embodiment wherein the leg 48 includes a lip 48L in lieu of the teeth 48T as shown and described in connection with FIGS. 6–11 above. As shown in FIG. 13, the spring clips 44 having the single lip 48L include an outer diameter between the legs 48 that is appreciably less than the slots 46 such that the legs 48 have to be forced inwardly in order to be inserted into the slots 46. As shown in FIG. 14, once inserted into the slots 46, the lip 48L of leg 48 engages underneath the edge of the slot 46. Once the lips 48L of the respective spring clips 44 are thus engaged, the fixture 12 is securely mounted relative to the electrical box 14. However, unlike the versions shown in FIGS. 6–11, the single lip 48L of leg 48 does not provide the degree of adjustability as was described above in connection with the teeth 48T of leg 48 of the spring clips 44 of FIGS. 6–11. Finally, it is noted that without departing from the spirit and scope of this invention, the configuration shown in FIGS. 12–14 may be reversed similar to that of FIGS. 9–11.

Figure 15:
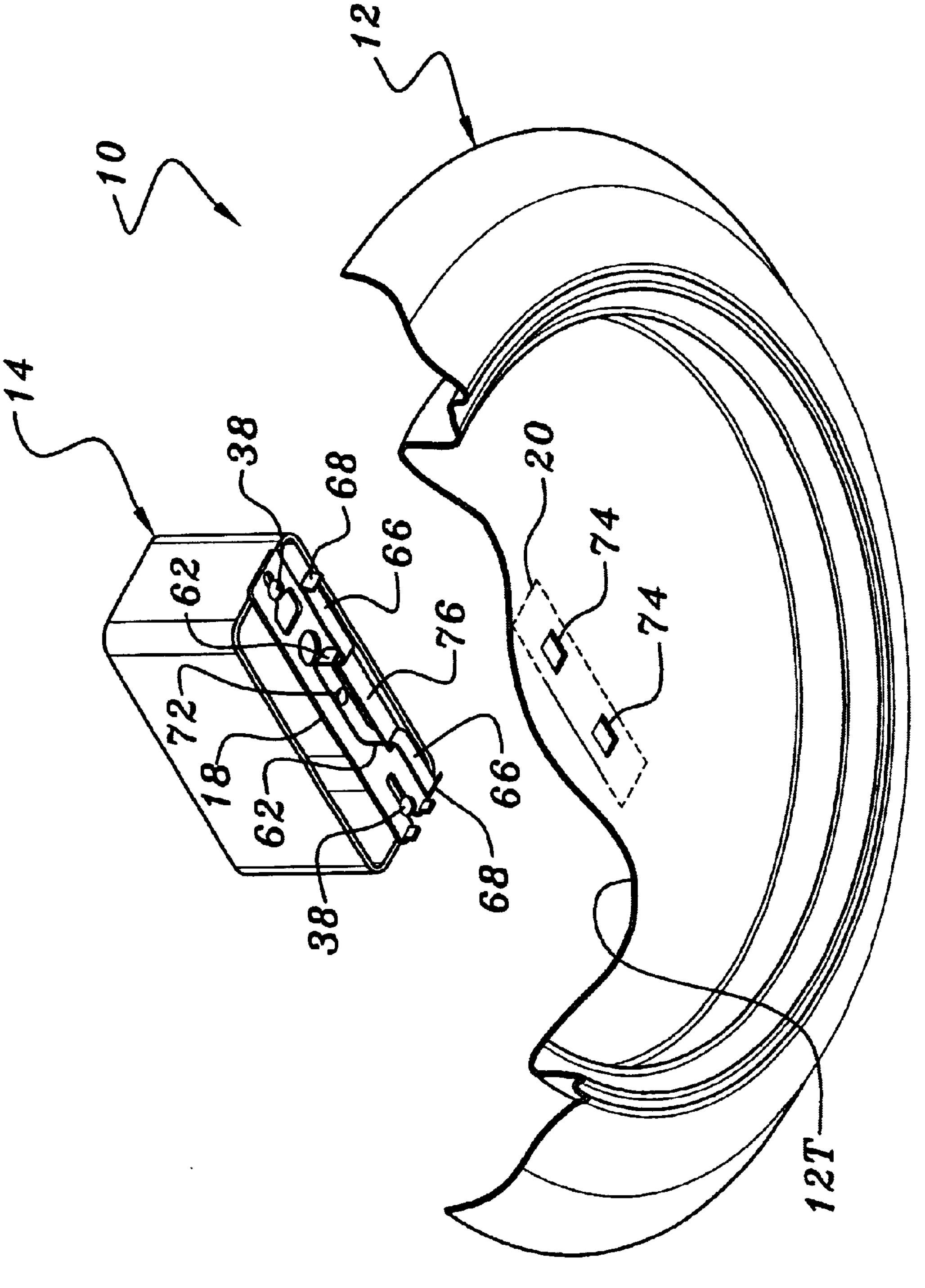
FIG. 15 is a perspective view, partially in cross-section of the fourth embodiment of the bracket assembly of the invention.

FIGS. 15–18 illustrate the fourth embodiment of the bracket assembly 10 of the invention. This fourth embodiment is similar to that of the second embodiment of FIGS. 6–14, but in lieu of the paired spring clips 44 shown in connection therewith, this fourth embodiment includes a male subbracket 18 having a single spring clip 60. The spring clip 60 includes a generally inverted U-shaped configuration with legs 62. Each of the legs 62 further include an outwardly extending extension 66 having an inturned end 68. Preferably, the extensions 66 to the legs 62 extend substantially radially outwardly as shown in FIG. 15. The spring clip 60 is connected to the male subbracket 18 by means of a fastener 72 such as a threaded fastener or rivet. The mounting plate 70 is connected to the electrical box 14 by means of screws 38 in the manner described above.

The female subbracket 20 of the fourth embodiment is similarly integrally formed in the topside 12T of the fixture 12 and comprises a pair of slots 74 dimensioned so as to receive the extensions 66 of legs 62.

Figure 16:
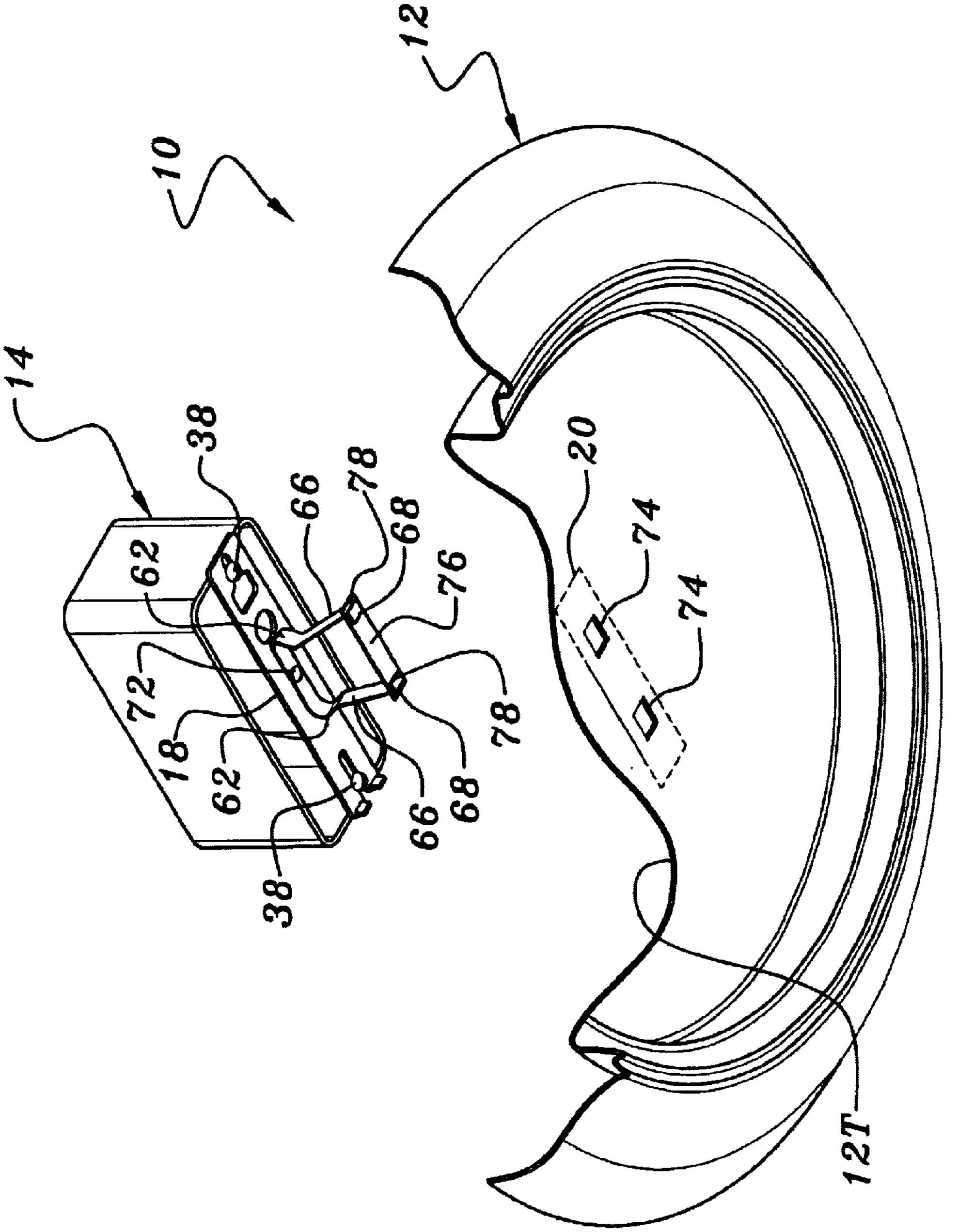
FIG. 16 is a perspective view, partially in cross-section, of FIG. 15 showing the retaining plate of the male subbracket being positioned so as to align the ends thereof with the corresponding female subbracket formed integrally with the light fixture.
Figure 17:
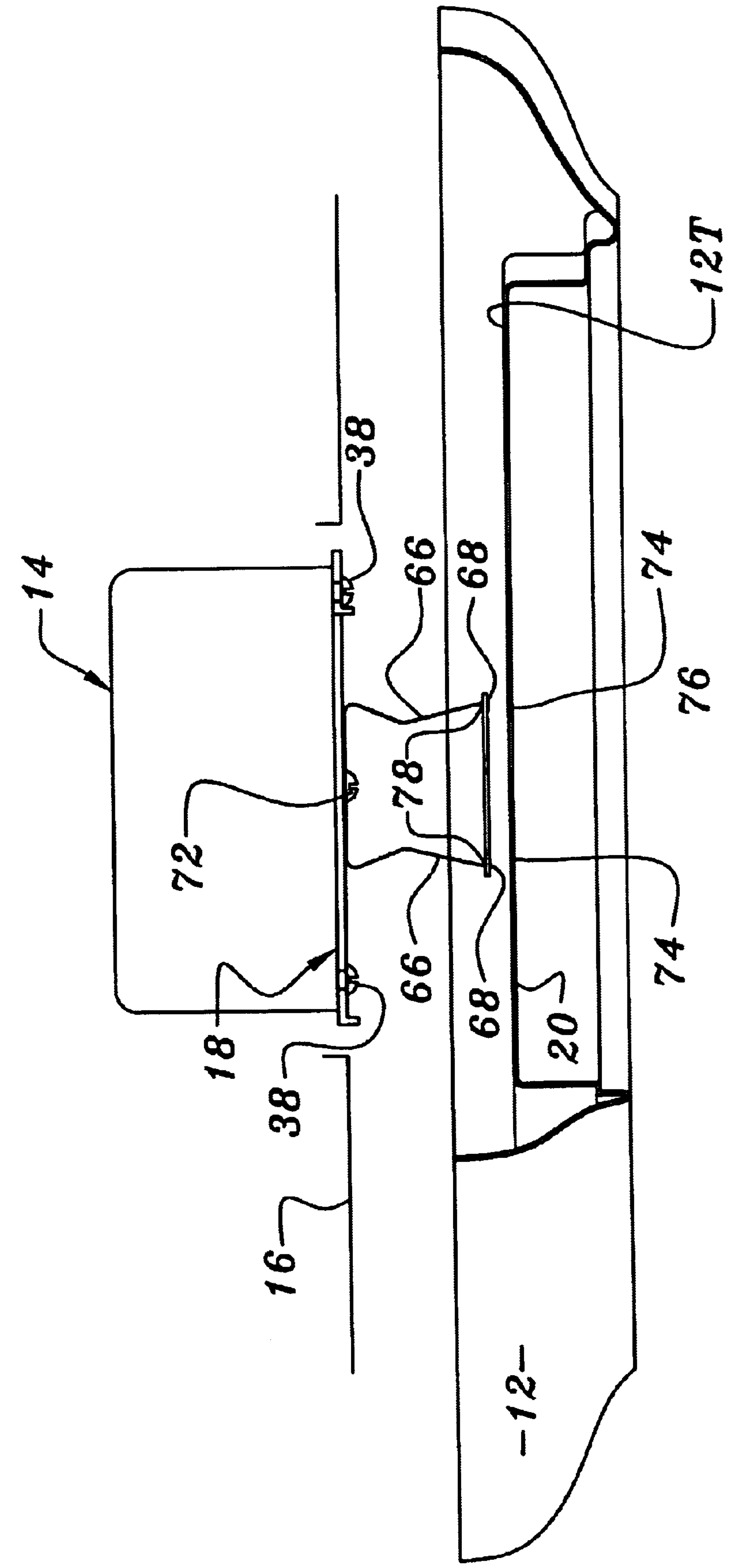
FIG. 17 is a side elevational view of FIG. 16 showing alignment of the respective subbrackets thereof.
Figure 18:
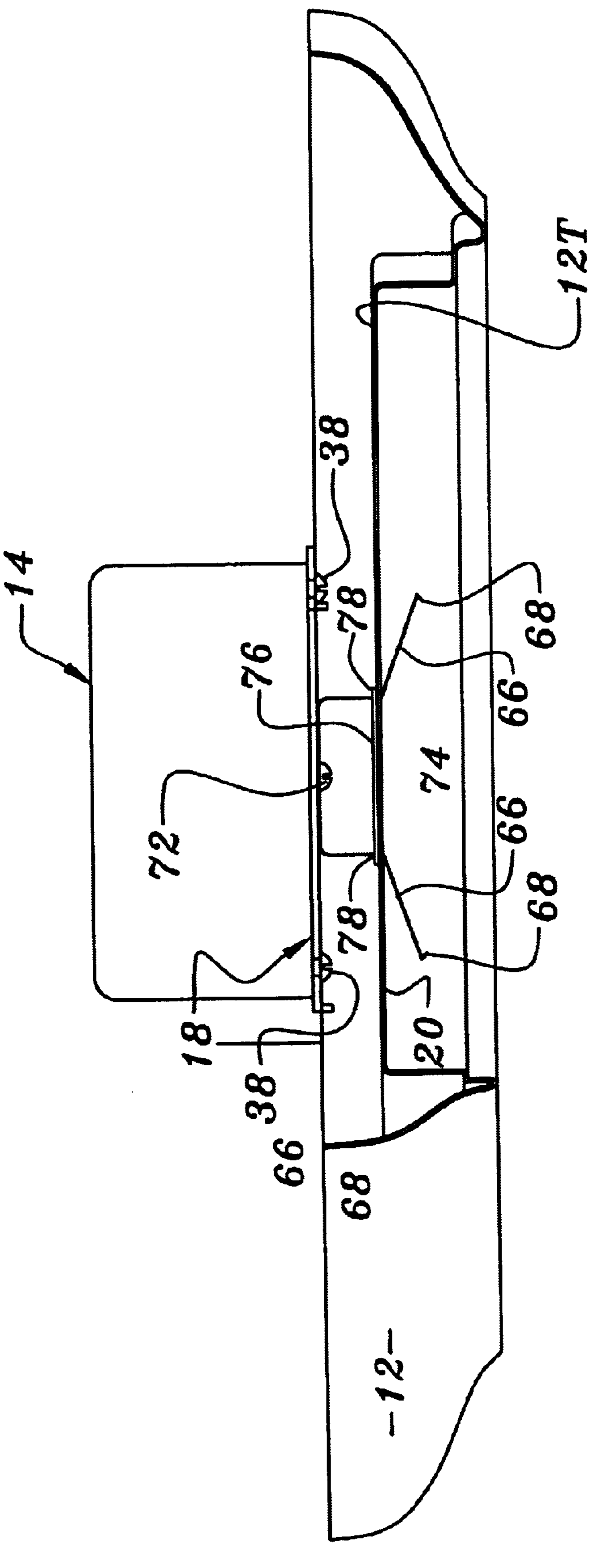
FIG. 18 is a side elevational view, partially in cross-section, showing the complete coupling of the male and female subbrackets of FIG. 16 such that the fixture is mounted flush to the wall or ceiling in which the electrical box is mounted.
Figure 19:
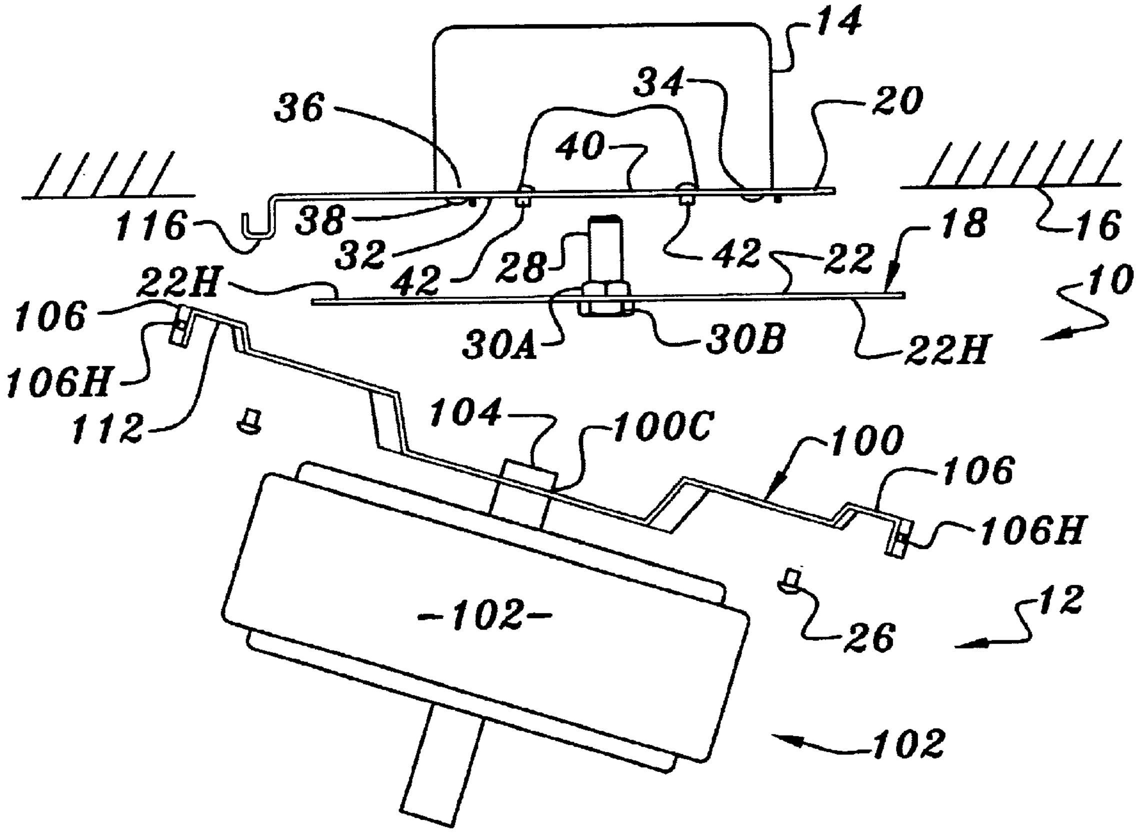
FIG. 19 is a partially exploded view showing the fifth embodiment of the bracket assembly of the invention particularly adapted for connection to a specially-configured hanger bracket of a ceiling fan.
Figure 20:
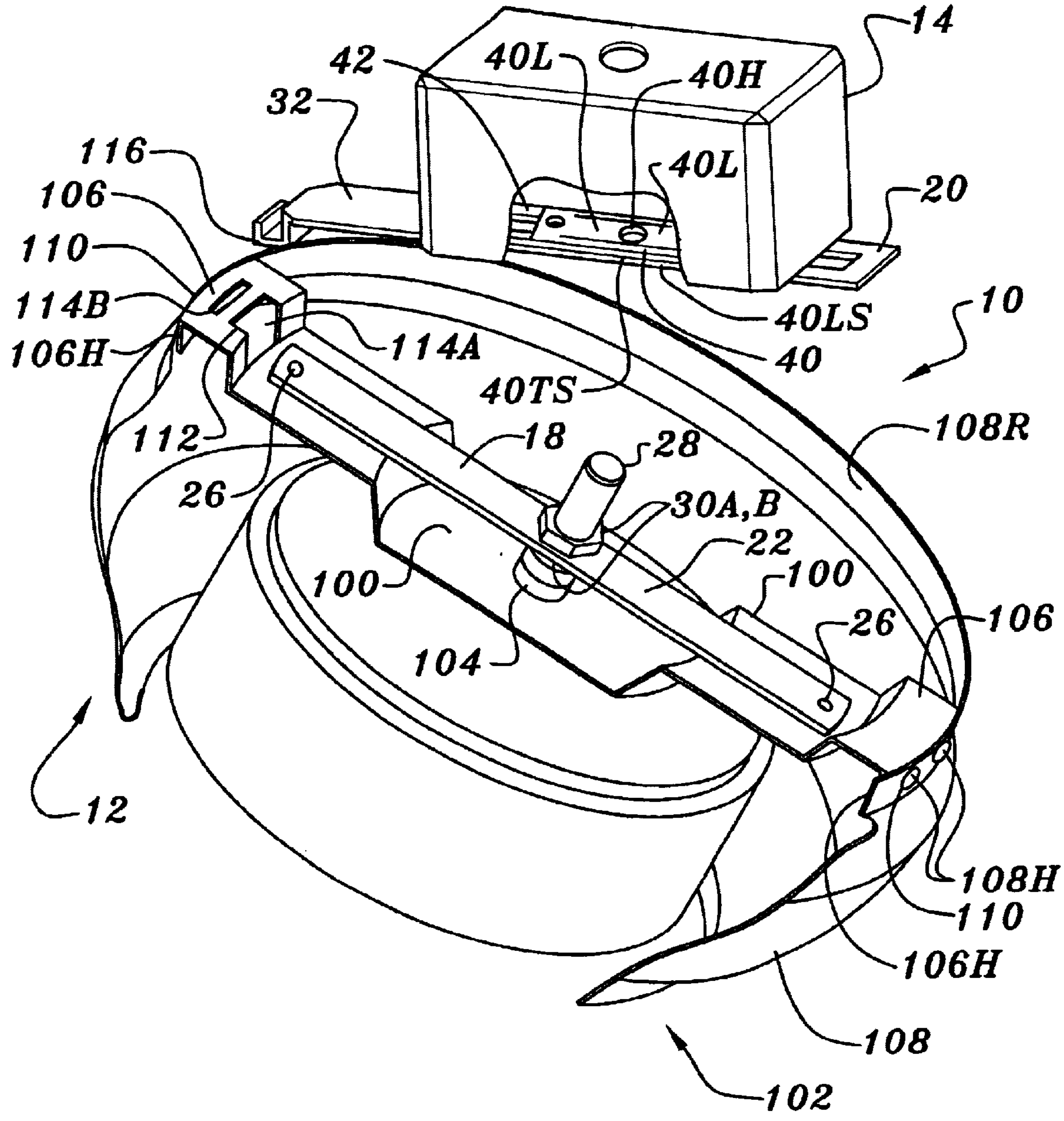
FIG. 20 is a perspective, partially cut-away, view of the fifth embodiment of the invention showing the positioning of the ceiling fan below the electrical box receptacle in alignment therewith for suspension therefrom.
Figure 21:
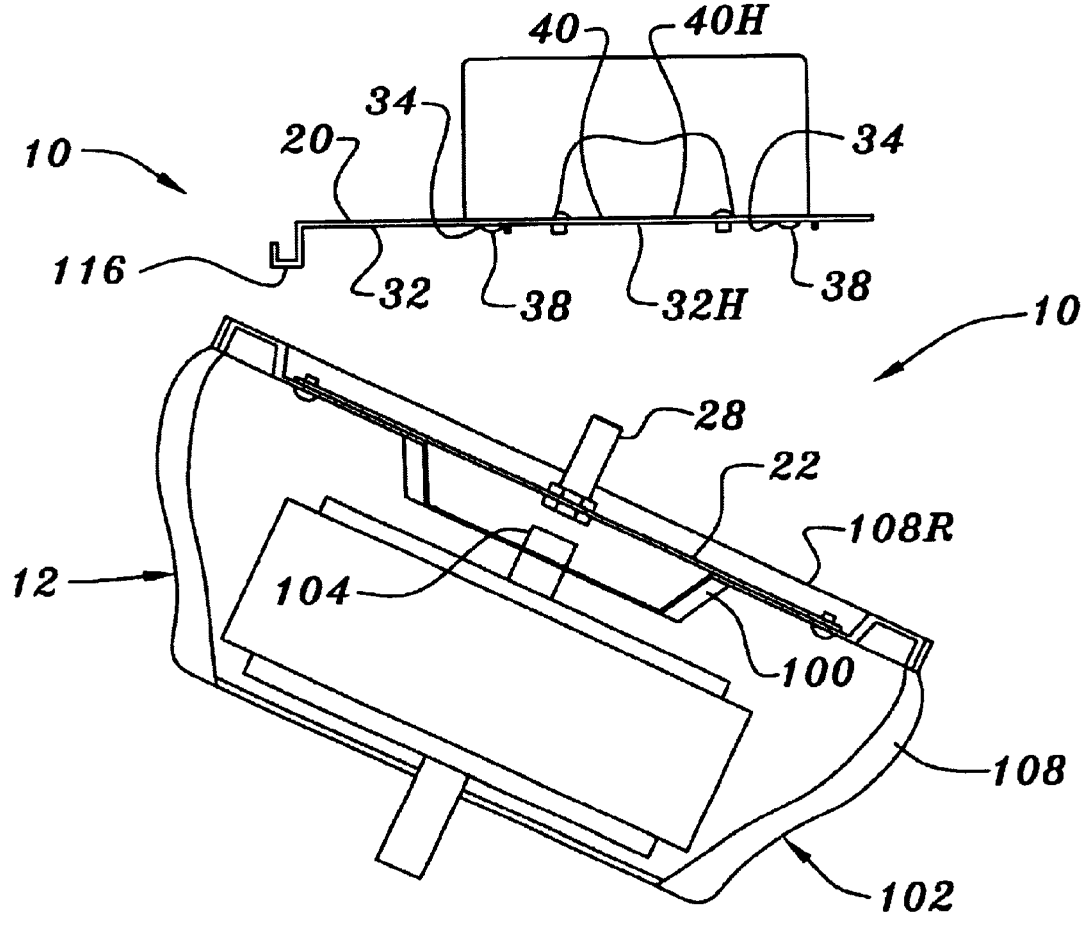
FIG. 21 is a transverse cross-sectional view of FIG. 20.
Figure 22:
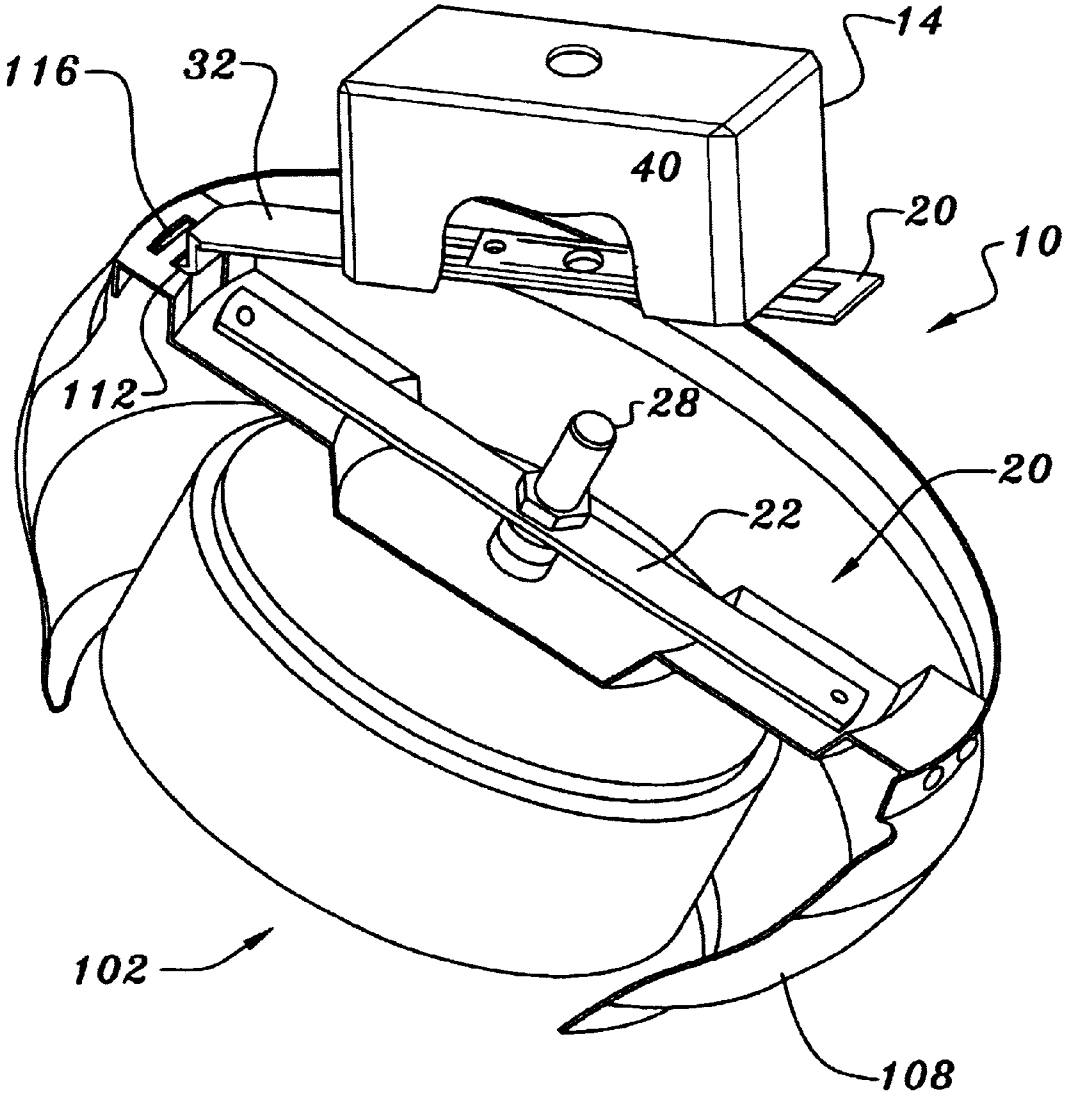
FIG. 22 is a perspective, partially cut-away, view of the fifth embodiment of the invention with the ceiling fan being suspended from the electrical box receptacle by means of the bracket assembly of the invention.
Figure 23:
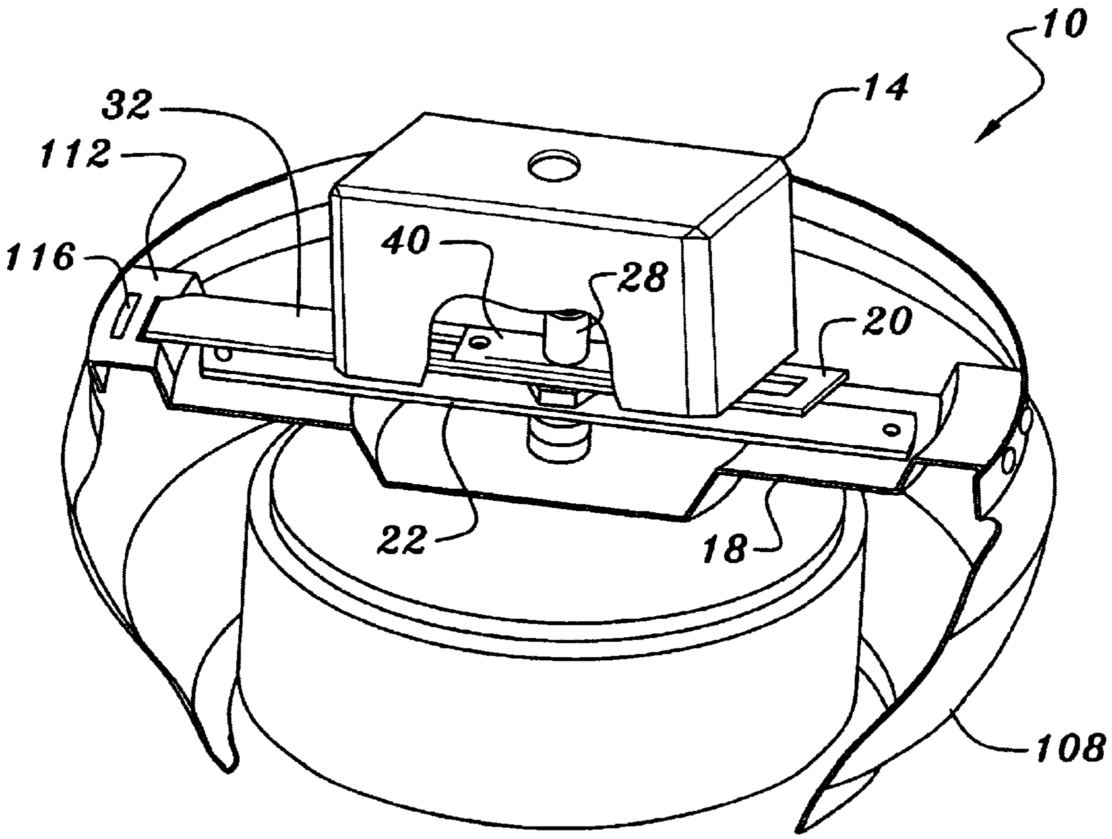
FIG. 23 is a perspective view, partially cut-away, of the fifth embodiment of the invention fully installed to the electrical box receptacle.
Figure 24:
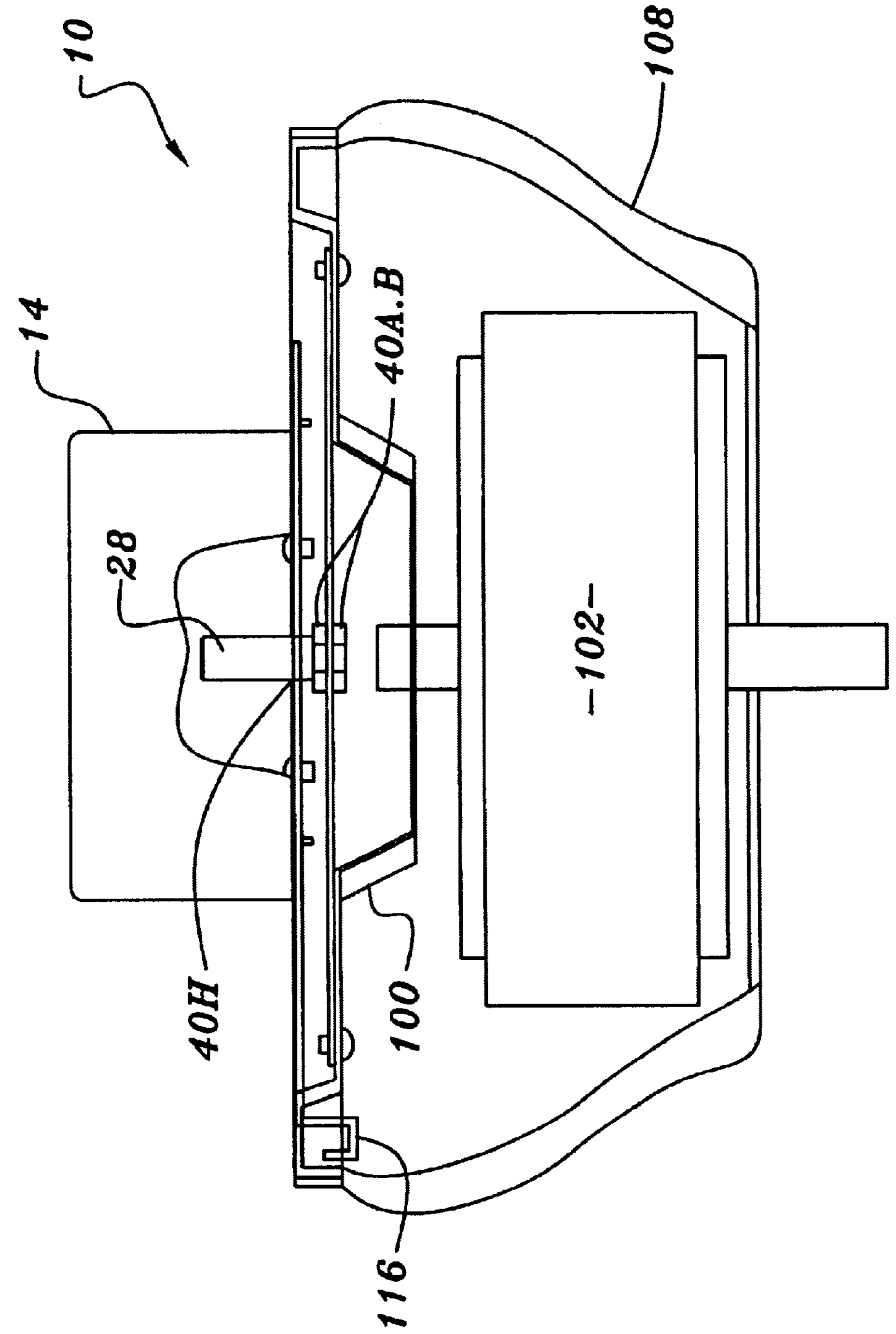
FIG. 24 is a transverse cross-sectional view of FIG. 23.

In order to facilitate insertion of the extensions 66 into the slots 74, a squeeze plate 76 is provided. The squeeze plate 76 comprises a generally elongated design having slots 78 at its ends for receiving the respective extensions 66 of legs 62, with the respective centers of slots 78 being approximately equal to the relaxed distance between the leg 62 (see FIG. 15). To facilitate assembly, the squeeze plate 76 is slid downwardly along the legs 62 and their extensions 66 to the inturned end 68 thereby causing extensions 66 to be squeezed together to a generally parallel configuration as shown in FIG. 16 with the squeeze plate 76 being retained by the inturned ends 68. As such, as shown in FIG. 17, the now parallel-positioned extensions 66 are in alignment with the respective slots 74 so that the extensions 66 may be inserted therein. As shown in FIG. 18, as the fixture 12 is forced upwardly, the squeeze plate 76 is likewise forced upwardly allowing the extensions 66 to return to their original non-parallel, radially-outwardly extending configuration. The fixture 12 is thus secured relative to the electrical box 14 flush with the ceiling or wall 16 in which the box 14 is installed. However, it is noted that fixture 12 may be removed by squeezing on the inturned ends 68 of the extensions 66 of the legs 62 to force them into a generally parallel alignment thereby releasing the fixture 12.

The fifth embodiment of the bracket assembly 10 of the invention is illustrated in FIGS. 19–25. This fifth embodiment comprises a design similar to the first embodiment as shown and described in connection with FIGS. 1–5. However, this fifth embodiment is particularly adapted for use in conjunction with a specially-configured hanger bracket 100 coupled to a conventional ceiling fan 102 such that the ceiling fan 102 may be first suspended from the electrical box receptacle 14 to facilitate wiring, and then pivoted upwardly to be quickly coupled into position through the use of the complementary male and female subbrackets 18 and 20 of the bracket assembly 10 of the invention.

More particularly, the fifth embodiment of the bracket assembly 10 of the invention comprises complementary male and female subbrackets 18 and 20. The male subbracket 18 comprises a mounting plate 22 having opposing threaded holes 22H allowing it to be fastened to the hanger bracket 100 by means of fasteners 26. The male subbracket 18 further comprises an upwardly extending threaded stud 28 positioned through a center hole 22C in the mounting plate 22 and secured into position by means of opposing threaded nuts 30A and 30B.

The female subbracket 20 comprises a flat mounting plate 32 having a center hole 32H. The mounting plate 32 further includes mounting holes 34 at opposing ends thereof allowing the mounting plate 32 to be mounted to the electrical box receptacle 14 by means of screws 38 that threadably engage the threaded holes 36 of the electrical box receptacle 14. The female subbracket 20 further comprises a leaf plate 40 having a center hole 40H defined by opposing leaves 40L that circumscribe the center hole 40H. The opposing leaves 40L are further defined by longitudinal slots 40LS and transverse slots 40TS. It is noted that the leaf plate 40 is connected to the mounting plate 32 by means of fasteners 42 such that the center hole 40H of the leaf plate 40 is concentrically positioned relative to the center hole 32H of the mounting plate 32. As described above in connection with the first embodiment of FIGS. 1–5, leaf plate 40 is dimensioned with its center hole 40H defined by the opposing leaves 40L including a diameter appreciably less than that of the threaded stud 28 such that, when the threaded stud 28 is inserted therein, the opposing leaves 40L bulge upwardly by virtue of the longitudinal and transverse slots 40LS and 40TS to ratchet over the threads of the threaded stud 28.

The specially-configured hanger bracket. 100 comprises an elongated design having a center hole 100C that allows it to be rigidly coupled to the fixed center shaft 104 of the ceiling fan 102. The hanger bracket 100 is preferably U-shaped at the center thereof about the center hole 100C so as to provide clearance for the lower nut 30B of the threaded stud 28. The outermost ends of the hanger bracket 100 each include a downwardly extending flange 106 with threaded holes 108H. The outer diameter as measured relative to the flanged ends 106 of the hanger bracket 100 is appreciably less than the inner diameter of the ceiling fan canopy 108 such that the canopy 108 may be positioned over the hanger bracket 100 with the rim 108R of the canopy 108 being secured to the flanged ends 106 of the bracket 100 by means of fasteners 110 such as threaded fasteners that engage through corresponding holes 108H in the rim 108R to then threadably engage respective holes 106H of the flanged ends 106.

To facilitate suspension during wiring, the hanger bracket 100 preferably comprises, at one of its flanged ends 106, a transverse suspension bar 112 that may be defined by the corresponding slots 114A and 114B. Correspondingly, the mounting plate 32 of the female subbracket 20 preferably comprises one end that is lengthened to extend well beyond the electrical box receptacle 14 and is configured with a downwardly extending hook member 116 substantially U-shaped in cross-section. The width of the hook member 116 is dimensioned to easily fit into slots 114A and 114B to hook the bar allowing it to be suspended from the hook member 116. It is noted that during such suspension, the ceiling fan 102 may be easily wired to the conventional household wiring existing in the electrical receptacle box 14. Once the wiring is complete, the ceiling fan 102 may be pivoted upwardly, with the bar 112 still being entrained within the hook member 116 such that the threaded stud 28 of the male subbracket 18 engages into the leaf plate 40 of the female subbracket 20 to be fully engaged therein in a position flush with the ceiling 16. Thus, it should be appreciated that the suspension of the bar 112 from the hook member 116 facilitates alignment of the complementary male and female subbrackets 18 and 20 during upwardly pivoting for assembly. It should further be appreciated that in the event the electrical box receptacle 14 is not flush with the ceiling 16, the ceiling fan 102 may still be installed flush with the ceiling 16 by virtue of the fact that the threaded stud 28 of the male subbracket 18 may engage into the leaf plate 40 of the female subbracket 20 at the appropriate depth to achieve the desired flush-mounting of the ceiling fan 102.

Figure 25:
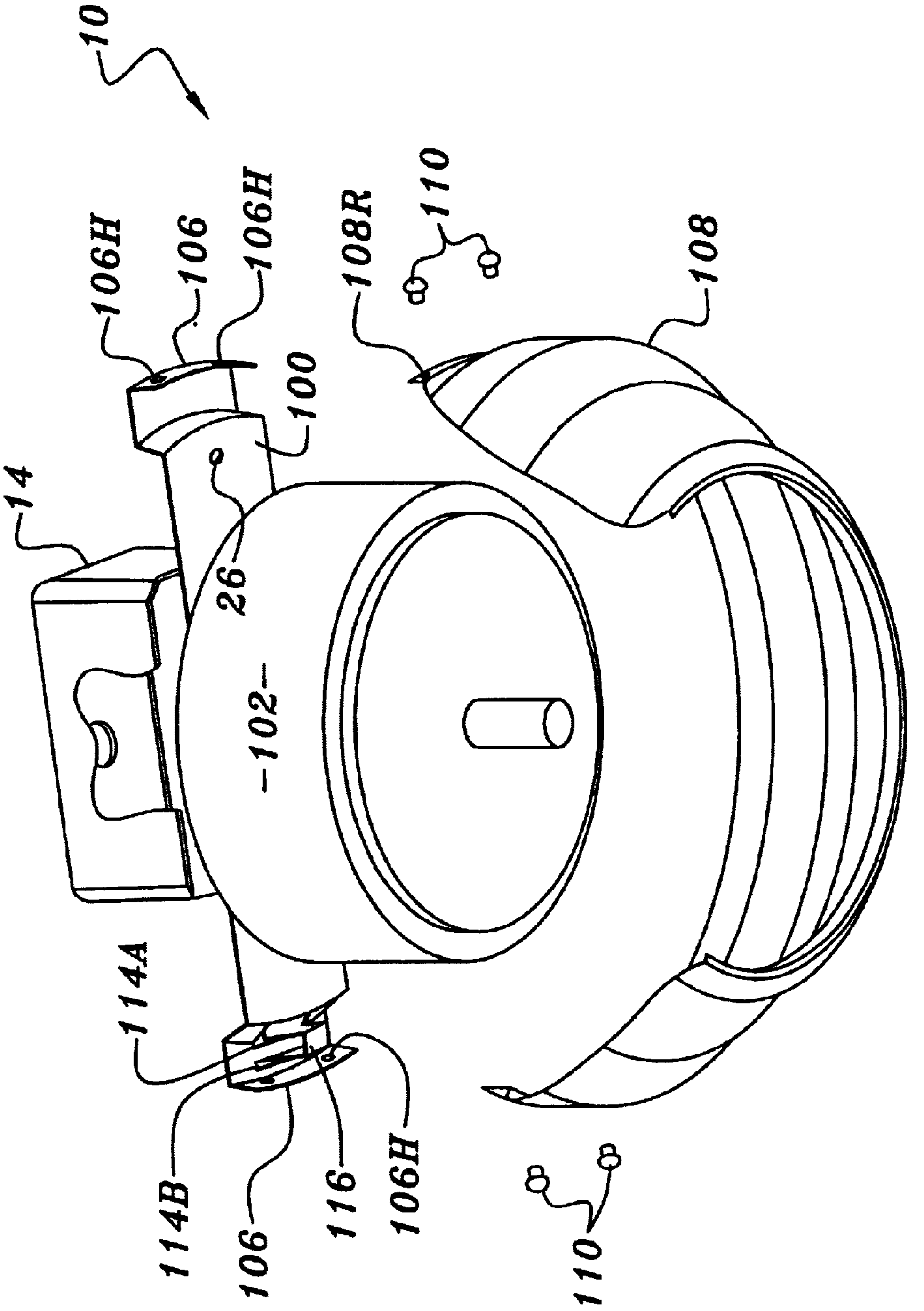
FIG. 25 is an exploded perspective view, partially in section, showing the fifth embodiment of the invention and the manner in which the ceiling fan canopy may be removed to allow access to the bracket assembly of the invention.
Figure 27:
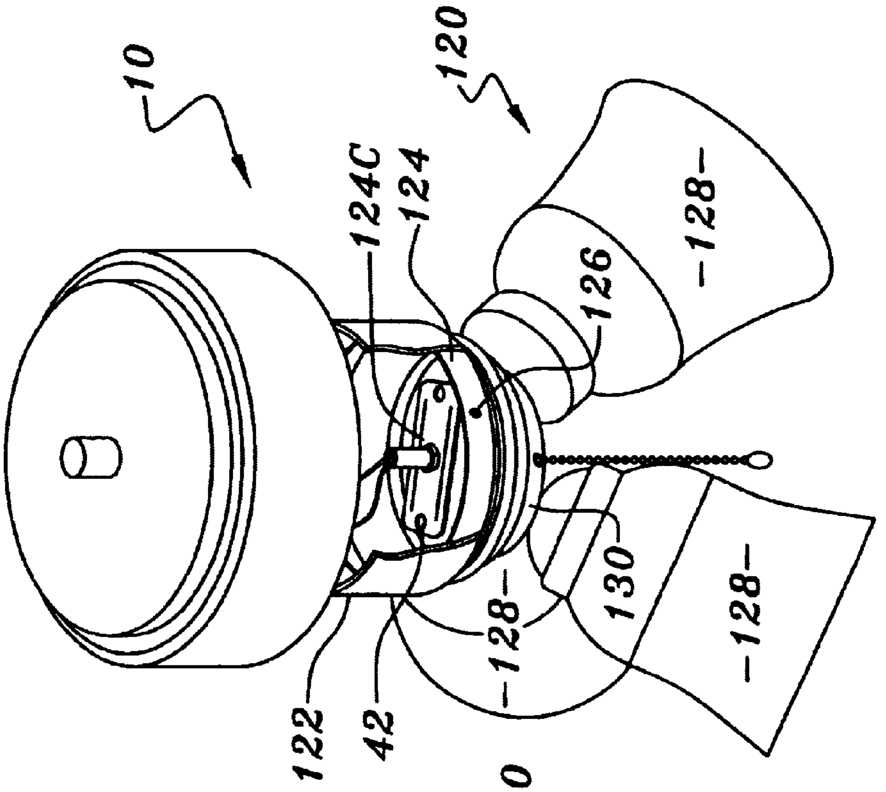
FIG. 27 is a perspective view, partially cut-away, of FIG. 26 with the light kit being fully installed into the switch housing of the ceiling fan.
Figure 26:
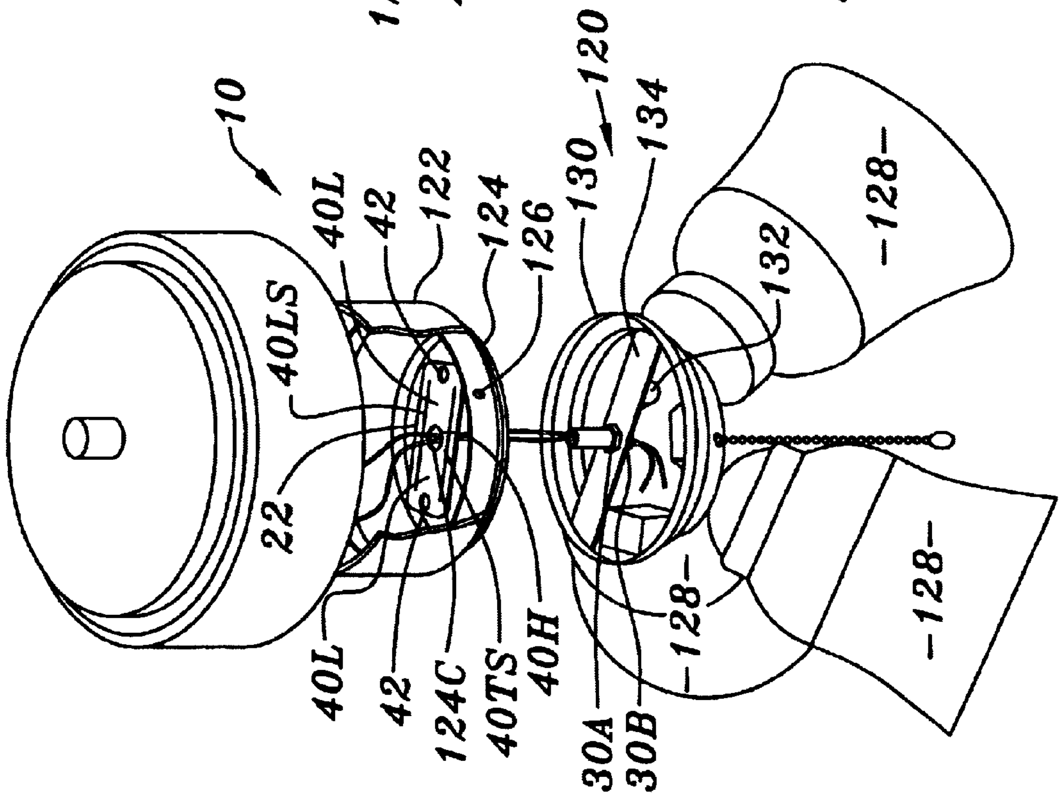
FIG. 26 is a perspective view, partially cut-away, showing the adaptation of the leaf plate and threaded stud of the first and fifth embodiments of the bracket assembly for use as a means for interconnecting a light kit to the switch housing of the ceiling fan.

In order to remove the ceiling fan 102 from the electrical box receptacle 14, the threaded fasteners 110 may be simply removed as shown in FIG. 25 to allow removal of the canopy 108. Upon removal of the canopy 108, access is provided to the heads of the fasteners 26 that interconnect the hanger bracket 100 with the mounting plate 22 of the male subbracket 18, thus allowing the hanger bracket 18 to be disconnected from the subbracket 18. Once the hanger bracket 100 is disconnected, it along with the ceiling fan 102 connected to it, may be suspended via the hook and bar engagement 116 and 112 to facilitate unwiring.

Without departing from the spirit and scope of this invention, it should be appreciated that in the fifth embodiment of the bracket assembly 10 of the invention as shown in FIGS. 19–25, the male and female subbrackets 18 and 20 of the bracket assembly 10 may be reversed such that the female subbracket 20 is made integral with or coupled to the hanger bracket 100 and wherein the male subbracket 18 together with its threaded stud 28 may be coupled to the electrical box receptacle 14.

It should also be appreciated that, without departing from the spirit and scope of this invention, the various embodiments of the bracket assembly 10 of the invention may be adapted for use in other applications where quick and easy coupling of a fixture to a support is desired.

One such application in which the bracket assembly embodiments 10 of the invention may be incorporated, comprises the coupling of a conventional light kit 120 to a conventional switch housing 122 of a ceiling fan 102. More particularly, conventional switch housings 122 comprise a generally circular cylindrical configuration with a cap 124 removably secured over its opened bottom end by means threaded fasteners 126. Conventional light kits 120 comprise a plurality of light housings 128 connected to a base plate 130 from which a hollow threaded stud 28 extends.

As typically packaged, the cap 124 is pre-installed into position in the switch housing 122. When a consumer desires to attach a light kit 120 to the switch housing 122, the cap 124 is removed and, via a threaded center hole, threaded onto the center hollow threaded stud 28 of the light kit 120. After wiring, the cap 124 is then reinstalled into the switch housing 122. It is noted that the wiring for the light kit 120 is wired to a conventional switch (not shown) that is factory installed through the wall of the switch housing 122.

The adaptation of the bracket assembly 10 of the invention for quickly coupling the light kits 120 to the switch housings 122, may be accomplished as follows. First, the cap 124 is provided with an unthreaded center hole 124C. The leaf plate 40 of the female subbracket 20 is connected to the inside surface of the cap 124 thus serving as an integral mounting plate 32 for the leaf plate 40. The leaf plate 40 is then secured into position by means of fasteners 42 in a position such that its center hole 40H of the leaf plate 40 is concentrically positioned relative to the center hole 124C of the cap 124.

The base plate 130 is fitted with the hollow threaded stud 28 at its center by means of bracket 134 to extend upwardly toward the center hole 124C of the cap 124 and center hole 40H of the leaf plate 40. A switch 132 for controlling the operation of the light kit 120 is connected relative to the threaded stud 28 by means opposing nuts 30A and 30B and the bracket 134. It is noted that the switch housing 122 with the pre-installed cap 124 and leaf plate 40 is preferably factory installed and packaged for shipment for retail purchase. Likewise, the hollow threaded stud 28, switch 132 and bracket 134 are preferably factory installed during the manufacture of the light kit 120 and packaged for shipment for retail sale.

Upon installation by the consumer, the consumer need only connect the wires of the light kit 120 to the wires contained in the switch housing 122, with such wiring extending through the hollow threaded stud 28 and the center hole 40H of the leaf plate 40. The threaded stud 28 is then pushed upwardly into the center hole 40H and ratcheted into position with the opposing leafs 40L of the leaf plate 40 rigidly securing the light kit 120 to the switch housing 122. In this assembled condition, the base plate 130 cosmetically covers the cap 124 so as to obscure the cap 124 as well as the internal wiring and switch 132. It is also noted that this assembly may be easily uninstalled by removing the threaded fasteners. 126 to remove the cap 124 and, after unwiring, then unscrewing the threaded stud 28 from the leaf plate 40 from the cap 124.

In each of the embodiments of the bracket assembly 10 of the invention, a tether, generally indicated by numeral 80, may be provided to interconnect the male subbracket 18 and the female subbracket 20. While many embodiments of the tether may suffice, a preferred tether 80 comprises one end having a T-bar configuration for insertion within a hole 82 formed in one of the subbrackets 18 or 20 and the other end of the tether 80 may be permanently affixed to the other subbracket 20 or 18 (see FIGS. 1 & 2). In this manner, the T-bar end 82 of the tether 80 may be easily coupled to the subbracket 18 or 20 allowing the fixture 12 to hang therefrom. While hanging, the fixture 12 may be conveniently wired to the electrical household wiring contained within the electrical box 14.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A bracket assembly for connecting an electrical fixture to a support, the bracket assembly comprising in combination:

a male subbracket including a stud for connection to one of the fixture or support;

a female subbracket including a leaf plate with opposing leafs for engaging opposing sides of said stud for connection to the other one of the fixture and the support;

said subbrackets being complementarily configured for coupling to each other by insertion of said stud of the male subbracket into said leaf plate of the female subbracket.

2. A bracket assembly for connecting a fixture to a support, the bracket assembly comprising in combination:

a male subbracket comprising a stud for connection to one of the fixture or support;

a female subbracket comprising a leaf plate with opposing leafs for engaging opposing sides of said stud of said male subbracket for connection to the other one of the fixture and the support;

said subbrackets being complementarily configured for coupling to each other.

3. The bracket assembly as set forth in claim 2, wherein said stud comprises a threaded stud and wherein said leaf plate engages threads of said threaded stud.

4. The bracket assembly as set forth in claim 3, wherein said male subbracket is connected to the support and said female subbracket is connected to the fixture.

5. The bracket assembly as set forth in claim 3, wherein said male subbracket is connected to the fixture and wherein said female subbracket is connected to the support.

6. The bracket assembly as set forth in claim 1, wherein said male subbracket comprises a spring clip for coupling with said female subbracket.

7. The bracket assembly as set forth in claim 6, wherein said spring clip comprises at least one leg which engages into a hole in said female subbracket.

8. A bracket assembly for connecting a fixture to a support, the bracket assembly comprising in combination:

a male subbracket including a spring clip having, at least one leg having teeth for connection to one of the fixture or support;

a female subbracket having a hole wherein an edge of said hole engages said teeth for connection to the other one of the fixture and the support;

said subbrackets being complementarily configured for coupling to each other.

9. The bracket assembly as set forth in claim 7, wherein one of said legs comprises a lip for engagement with an edge of said hole.

10. A bracket assembly for connecting a fixture to a support, the bracket assembly comprising in combination:

a male subbracket comprising a spring clip having at least one leg comprising an extension resiliently positioned in a radially outward direction relative to said male subbracket for connection to one of the fixture or support;

a female subbracket having a hole that engages said leg for connection to the other one of the fixture and the support;

said subbrackets being complementarily configured for coupling to each other.

11. The bracket assembly as set forth in claim 10, wherein said legs each comprise said extension and further including a squeeze plate coupled to said extensions for resiliently moving said extensions to a position for insertion into said hole of said female subbracket.

12. The bracket assembly as set forth in claim 11, wherein said extensions each comprise a configuration for retaining said squeeze plate.

13. The bracket assembly as set forth in claim 11, wherein said extensions each comprise an end for retaining said squeeze plate.

14. The bracket assembly as set forth in claim 1, further comprising a tether interconnecting said male subbracket and said female subbracket to facilitate wiring of the fixture to the support.

15. The bracket assembly as set forth in claim 5, further including a hanger bracket interconnecting said male subbracket and the fixture.

16. The bracket assembly as set forth in claim 15, wherein said hanger bracket is removably pivotally connected to said female subbracket such that the fixture may be first suspended from the support to facilitate wiring, and then pivoted upwardly to couple said male subbracket to said female subbracket.

17. The bracket assembly as set forth in claim 16, wherein said hanger bracket is rigidly coupled to a center shaft of the fixture.

18. The bracket assembly as set forth in claim 16, wherein said hanger bracket comprises outermost ends for coupling to a canopy of the fixture.

19. The bracket assembly as set forth in claim 18, wherein said outermost ends of said hanger bracket include a downwardly extending flange to which said canopy is coupled.

20. The bracket assembly as set forth in claim 18, wherein said canopy includes a rim that is coupled to said outermost ends of said hanger bracket.

21. The bracket assembly as set forth in claim 16, wherein said hanger bracket being removably pivotally connected to said female subbracket comprises a transverse suspension bar formed in one of said female subbracket and said male subbracket and a hook member formed in the other one of said female subbracket and said male subbracket, whereby said hook member may be suspended from said bar.

22. The bracket assembly as set forth in claim 16, wherein said bar is defined by opposing slots and wherein a width of said hook member is dimensioned to easily fit into said slots to hook the said bar.

23. The bracket assembly as set forth in claim 16, wherein the fixture includes a canopy that is removably connected to said hanger bracket.

24. The bracket assembly as set forth in claim 1, wherein said support comprises an electrical box receptacle.

25. The bracket assembly as set forth in claim 24, wherein said fixture comprises a light fixture.

26. The bracket assembly as set forth in claim 24, wherein said fixture comprises a ceiling fan.

27. The bracket assembly as set forth in claim 1, wherein said support comprises a ceiling fan switch housing.

28. The bracket assembly as set forth in claim 27, wherein said fixture comprises a light kit fixture.

29. The bracket assembly as set forth in claim 28, wherein said ceiling fan switch housing comprises a cap that is covered by a base plate said light kit fixture.

30. A bracket assembly for connecting a ceiling fan to a support installed within a ceiling, the bracket assembly comprising in combination:

a male subbracket;

a hanger bracket including a transverse suspension bar formed in one of said female subbracket and said male subbracket and a hook member formed in the other one of said female subbracket and said male subbracket, whereby said hook member may be suspended from said bar;

means for mounting said hanger bracket to the ceiling fan;

means for connecting said male subbracket to said hanger bracket;

a female subbracket:

means for connecting said female subbracket to the support; and said subbrackets including means for intercoupling.

31. The bracket assembly as set forth in claim 30, wherein said hanger bracket includes means for removably and pivotally suspending said hanger bracket relative to said female subbracket.

32. A bracket assembly for connecting a ceiling fan to a support installed within a ceiling, the bracket assembly comprising in combination:

a male subbracket;

a female subbracket;

a hanger bracket including means for removably and pivotally suspending said hanger bracket relative to said female subbracket wherein said means further comprises a transverse suspension bar formed in one of said female subbracket and said male subbracket and a hook member formed in the other one of said female subbracket and said male subbracket, whereby said hook member may be suspended from said bar;

means for mounting said hanger bracket to the ceiling fan;

means for connecting said male subbracket to said hanger bracket;

means for connecting said female subbracket to the support; and said subbrackets including means for intercoupling.

33. The bracket assembly as set forth in claim 32, wherein said bar is defined by opposing slots and wherein a width of said hook member is dimensioned to easily fit into said slots to hook the said bar.

34. The bracket assembly as set forth in claim 30, wherein the ceiling fan includes a canopy and further including means for removably connecting said canopy to said hanger bracket.

35. The bracket assembly as set forth in claim 34, wherein means for removably connecting said canopy to said hanger bracket comprises said hanger bracket having outermost ends for coupling to said canopy.

36. The bracket assembly as set forth in claim 35, wherein said outermost ends of said hanger bracket include a downwardly extending flange to which said canopy is coupled.

37. The bracket assembly as set forth in claim 36, wherein said canopy includes a rim that is coupled to said outermost ends of said hanger bracket.

* * * * *